(12) United States Patent
Hayashi et al.

(10) Patent No.: US 7,781,786 B2
(45) Date of Patent: Aug. 24, 2010

(54) SEMICONDUCTOR DEVICE HAVING A HETEROJUNCTION DIODE AND MANUFACTURING METHOD THEREOF

(75) Inventors: Tetsuya Hayashi, Yokosuka (JP);
Masakatsu Hoshi, Yokohama (JP);
Yoshio Shimoida, Yokosuka (JP);
Hideaki Tanaka, Yokohama (JP);
Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 375 days.

(21) Appl. No.: 11/783,577

(22) Filed: Apr. 10, 2007

(65) Prior Publication Data

US 2007/0235745 A1 Oct. 11, 2007

(30) Foreign Application Priority Data

Apr. 11, 2006 (JP) .............................. 2006-108557
Feb. 2, 2007 (JP) .............................. 2007-024314

(51) Int. Cl.
| H01L 29/22 | (2006.01) |
| H01L 33/00 | (2006.01) |
| H01L 29/732 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/739 | (2006.01) |
| H01L 29/861 | (2006.01) |
| H01L 31/107 | (2006.01) |
| H01L 29/864 | (2006.01) |

(52) U.S. Cl. .......................... 257/94; 257/183; 257/186; 257/199; 257/603; 257/604; 257/605; 257/606; 257/E27.04; 257/E29.338; 257/E31.065; 257/E31.066

(58) Field of Classification Search ................. 257/199, 257/603–606, E27.04, E29.338, E31.065, 257/E31.066, 94, 183, 186
See application file for complete search history.

(56) References Cited

U.S. PATENT DOCUMENTS

| 3,821,774 | A | * | 6/1974 | Beale | ........................... 257/13 |
| 5,168,328 | A | * | 12/1992 | Bailey | ........................ 257/199 |
| 5,371,389 | A | | 12/1994 | Matsuno et al. | |
| 5,748,275 | A | * | 5/1998 | Sato et al. | .................... 349/144 |

(Continued)

FOREIGN PATENT DOCUMENTS

EP 1503425 (A2) 2/2005

(Continued)

OTHER PUBLICATIONS

H. Tanaka et al., Ultra-low $V_{on}$ and High Voltage 4H-SiC Heterojunction Diode, IEEE Proceedings of the 17th International Symposium on Power Semiconductor Devices & IC's, May 2005, 4 pages.

*Primary Examiner*—Ida M Soward
(74) *Attorney, Agent, or Firm*—Foley & Lardner LLP

(57) ABSTRACT

Impurity concentration of a second semiconductor region is set such that when a predetermined reverse bias is applied to a heterojunction diode configured by a first semiconductor region and the second semiconductor region, a breakdown voltage at least in a heterojunction region other than outer peripheral ends of the heterojunction diode is a breakdown voltage of a semiconductor device.

15 Claims, 13 Drawing Sheets

U.S. PATENT DOCUMENTS

| | | | |
|---|---|---|---|
| 6,120,600 A * | 9/2000 | Edmond et al. | 117/89 |
| 6,614,086 B2 | 9/2003 | Kim et al. | |
| 6,787,820 B2 * | 9/2004 | Inoue et al. | 257/192 |
| 6,852,612 B2 * | 2/2005 | Nishii et al. | 438/581 |
| 7,138,668 B2 * | 11/2006 | Hayashi et al. | 257/183 |
| 7,217,950 B2 * | 5/2007 | Kaneko et al. | 257/20 |
| 7,256,432 B2 * | 8/2007 | Okamoto et al. | 257/192 |
| 7,282,379 B2 * | 10/2007 | Goto et al. | 438/22 |
| 7,368,762 B2 * | 5/2008 | Tennant et al. | 257/184 |
| 7,436,004 B2 * | 10/2008 | Shimoida et al. | 257/183 |
| 7,507,999 B2 * | 3/2009 | Kusumoto et al. | 257/77 |
| 2002/0127890 A1 | 9/2002 | Andoh | |
| 2004/0031971 A1 | 2/2004 | Shimoida et al. | |
| 2005/0012143 A1 * | 1/2005 | Tanaka et al. | 257/328 |
| 2005/0045892 A1 * | 3/2005 | Hayashi et al. | 257/77 |
| 2005/0045982 A1 | 3/2005 | Shenai | |
| 2006/0060917 A1 * | 3/2006 | Hayashi et al. | 257/330 |
| 2009/0020834 A1 * | 1/2009 | Ootsuka et al. | 257/409 |

FOREIGN PATENT DOCUMENTS

| | | |
|---|---|---|
| JP | 2003-318413 A | 7/2003 |
| JP | 2005-303025 (A) | 10/2005 |
| KR | 2002-0049159 (A) | 6/2002 |

* cited by examiner

SEMICONDUCTOR DEVICE HAVING A HETEROJUNCTION DIODE AND MANUFACTURING METHOD THEREOF

BACKGROUND OF THE INVENTION

1. Field of the Invention

The present invention relates to a semiconductor device including a high resistance heterojunction diode and a manufacturing method thereof.

2. Description of the Related Art

Conventionally, a technique disclosed in Japanese Patent Application Laid-open No. 2003-318413 has been known as a similar technique of the present invention. In Japanese Patent Application Laid-open No. 2003-318413, an N-type polycrystalline silicon region is formed in a contacting manner on one main surface of a semiconductor base substrate formed with an N⁻-type epitaxial region on an N⁺-type substrate region, and the epitaxial region and the N-type polycrystalline silicon region form a heterojunction. On the rear surface of the N⁺-type substrate region, a rear surface electrode is formed.

In the conventional technique thus configured, when the rear surface electrode is a cathode and the polycrystalline silicon region is an anode, and a current is passed between the cathode and the anode, rectification occurs on a junction interface between the polycrystalline silicon region and the epitaxial region, whereby a diode characteristic is obtained. For example, when the cathode is grounded and a positive electric potential is applied to the anode, a conductive characteristic that corresponds to a forward characteristic of a diode is obtained. On the other hand, when a negative electric potential is applied to the anode, a rejection characteristic that corresponds to a reverse characteristic of the diode is obtained. Both the forward characteristic and the reverse characteristic exhibit a characteristic similar to that exhibited by a Schottky junction configured by a metallic electrode and a semiconductor material.

In such a conventional technique, when an impurity density or a conductivity type of the polycrystalline silicon region is changed, it becomes possible to arbitrarily configure a diode having a predetermined reverse characteristic (forward characteristic corresponding thereto), for example. Thereby, it is more advantageous than a diode configured by the Schottky junction in that a diode of an appropriate breakdown voltage system can be optionally configured.

SUMMARY OF THE INVENTION

However, in the conventional structure, when the heterojunction is formed simply by using polycrystalline silicon, the forward and reverse characteristics result in developing a tendency similar to the Schottky junction diode. Therefore, it is not possible to draw a performance, as an electric characteristic, different from that of the Schottky junction.

The present invention has been achieved in view of the above problems, and an object thereof is to provide a semiconductor device having a higher avalanche resistance characteristic as compared to a Schottky junction diode, and a manufacturing method thereof.

To achieve the above object, in the present invention, the means for solving the conventional problems is a semiconductor device including a heterojunction diode configured by a first semiconductor region and a second semiconductor region having a band gap different from that of the first semiconductor region and forming heterojunction with the first semiconductor region, wherein the heterojunction region is formed such that when a predetermined reverse bias is applied to the heterojunction diode, a breakdown voltage at least in a heterojunction region other than outer peripheral ends of the heterojunction diode is a breakdown voltage of the semiconductor device.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

DETAILED DESCRIPTION OF THE PREFERRED EMBODIMENTS

Preferred embodiments of the present invention will be explained below with reference to the accompanying drawings.

First Embodiment

Figure 1:
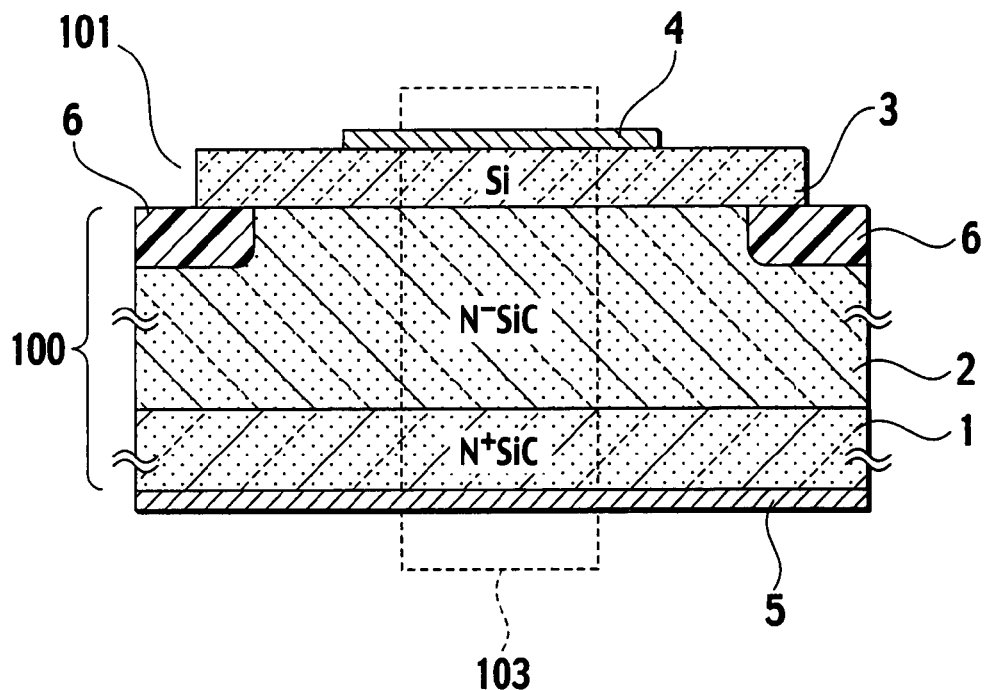
FIG. 1 is a cross-sectional view showing a configuration of a semiconductor device according to a first embodiment of the present invention.

FIG. 1 is a cross-sectional view showing a configuration of a semiconductor device according to a first embodiment of the present invention. The semiconductor device of the first embodiment shown in FIG. 1 configures a heterojunction diode in which a heterojunction between silicon carbide and silicon is employed. Hereinafter, an explanation is given of a case where silicon carbide is employed as a substrate material of a first semiconductor region 100.

In FIG. 1, the first semiconductor region 100 is configured by a substrate material in which an N$^-$-type drift region 2 is formed on an N$^+$-type substrate region 1 of which the polytype of silicon carbide is 4H, for example. The substrate region 1, of which the resistivity is several to tens of mΩcm, and thickness is about tens or hundreds of micrometers, can be used. The drift region 2, of which N-type impurity density is $10^{15}$ to $10^{18}$ cm$^{-3}$, and thickness is several to tens of micrometers, for example, can be used. In the first embodiment, an explanation is given of a case where the impurity density of $10^{16}$ cm$^{-3}$ and thickness of 10 μm, for example, is used. In the first embodiment, an explanation is given of a case where the first semiconductor region 100 is a substrate comprised of the substrate region 1 and the drift region 2. However, a substrate comprised solely of the substrate region 1 can be used, irrespective of the magnitude of the resistivity.

As a second semiconductor region 101, a first hetero semiconductor region 3 comprised of polycrystalline silicon, of which band gap is smaller than that of silicon carbide, is stacked and formed so as to contact a main surface that opposes a junction surface, of the drift region 2, with the substrate region 1. At the junction between the drift region 2 and the first hetero semiconductor region 3, a heterojunction diode made of a material, of which band gap of the polycrystalline silicon is different from that of silicon carbide, is formed, and on the junction interface, an energetic barrier exists. In the present invention, when a predetermined reverse bias is applied to the heterojunction diode, the impurity density of the first hetero semiconductor region 3 is set such that avalanche breakdown occurs at least in the first hetero semiconductor region 3. For example, an explanation is given of a case where the conductivity type is P-type, the impurity density is $10^{17}$ cm$^{-3}$, and the thickness is 0.5 μm.

In the first embodiment, a first electrode 4 is formed so as to contact the first hetero semiconductor region 3, and a second electrode 5 is formed so as to contact the substrate region 1, respectively. A metallic material in which Al (aluminum) 5000 Å is stacked on Ti (titanium) 2000 Å, for example, is used for the first electrode 4, and a metallic material in which Ni (nickel) 3000 Å is stacked on Ti (titanium) 5000 Å, for example, is used for the second electrode 5, respectively.

When such a heterojunction diode is formed in a finite region, an end portion will be always present in an active region. FIG. 1 shows a case where end portions of the heterojunction portion between the drift region 2 and the first hetero semiconductor region 3 define outermost peripheral ends of the active region. As an example, electric-field relaxation regions 6 are formed in the end portions.

Generally, in the outermost peripheral ends of the active region unlike a main region 103 other than the active region, a changing point occurs in an electric potential distribution and an electric field distribution. The electric-field relaxation regions 6 function to relax an amount of the change. As an example, in this first embodiment, an explanation is given of a case where the electric-field relaxation region 6 is configured by a material made of 4H—SiC, of which conductivity type is P-type opposite to the drift region 2. However, the electric-field relaxation regions 6 can be inactive regions having a high resistance, and configured by a material having high insulation such as SiO$_2$. Thus, in this first embodiment, configured is a vertical diode where the first electrode 4 is an anode and the second electrode 5 is a cathode.

An operation of the first embodiment is explained next.

When a voltage is applied between the first electrode 4 and the second electrode 5, rectification occurs on the junction interface between the first hetero semiconductor region 3 and the drift region 2, whereby a diode characteristic is obtained. Firstly, the second electrode 5 (cathode) is a ground potential, and a positive electric potential is applied to the first electrode 4 (anode), the heterojunction diode shows a forward characteristic, and shows a conductive characteristic like a Schottky junction diode, similarly to the conventional structure. That is, in the forward characteristic, a forward current passes by a voltage drop determined by a sum of contained electric potentials spread from the heterojunction portion to both sides of the drift region 2 and the first hetero semiconductor region 3. For example, in this first embodiment, the sum of the contained electric potentials spread from the heterojunction portion to the both sides of the drift region 2 and the first hetero semiconductor region 3 is about 1.2 V. Thus, a forward current passes by the voltage drop corresponding thereto.

At this time, also in a PN junction diode formed between the electric-field relaxation regions 6 and the drift region 2, a forward bias is generated. However, a contained electric potential is about 3V, and thus, a current does not pass between the electric-field relaxation regions 6 and the drift region 2.

Figure 2:
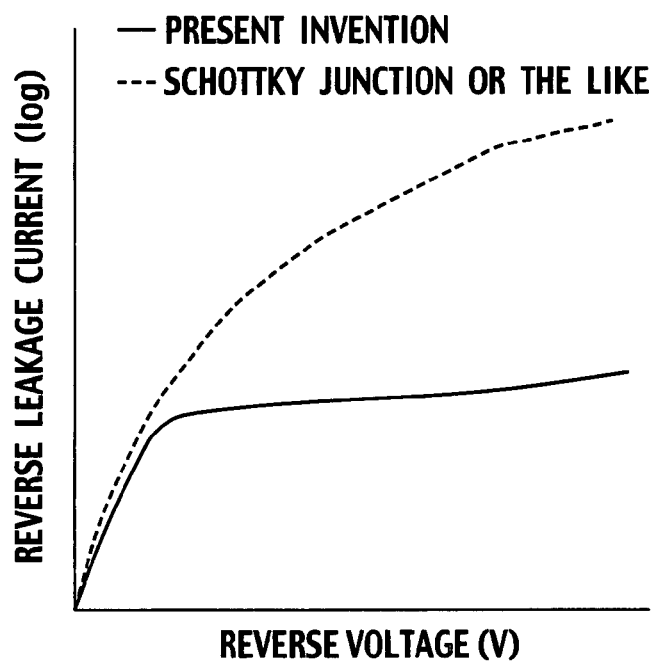
FIG. 2 is a graph showing reverse current-voltage characteristics between the present invention and a Schottky junction diode.

Next, the first electrode 4 (anode) is a ground potential, and a positive electric potential is applied to the second electrode 5 (cathode), the heterojunction diode shows a reverse characteristic, hence showing a cutoff characteristic. In this first embodiment, in the main region 103 of the active region, the conductivity type of the first hetero semiconductor region 3 is P-type. Thus, as shown in FIG. 2, the cutoff characteristic operates like a PN junction diode. This is because in a configuration where the conductivity type of the first hetero semiconductor region 3 is P-type and that of the drift region 2 is N-type, as a leakage current characteristic provided by a carrier generated under a predetermined electric field as is observed in the PN junction diode becomes increasingly dominant, a leakage current via the energetic barrier of the heterojunction interface can be greatly reduced. Hereinafter, the reason for that is explained in detail.

The leakage current characteristic of the Schottky junction diode is determined almost uniquely by a height of a Schottky barrier formed by a difference between an electron affinity of a semiconductor material and a work function of a Schottky metal. However, the heterojunction diode in the conventional structure and in the first embodiment is configured by a junction formed of different semiconductor materials. Thus, the leakage current characteristic is determined by the height of the energetic barrier occurring mainly between different semiconductor materials and a magnitude of a supply source of a majority carrier, which is the origin of the leakage current.

Among these, the height of the energetic barrier is approximately determined by each of the semiconductor materials of the drift region 2 comprised of silicon carbide and the first hetero semiconductor region 3 comprised of silicon. Thus, the height of the energetic barrier has a performance similar to that of the Schottky junction diode or the conventional structure. On the other hand, in the case of the first embodiment, the supply source of the majority carrier, which serves as the origin of the leakage current, is significantly small as compared to the case of the Schottky junction diode and the conventional structure. That is, this is due to the fact that the first hetero semiconductor region 3 is configured by P-type. Thereby, it becomes difficult for conduction electrons, which serve as the majority carrier for the N-type drift region 2, to be generated in the first hetero semiconductor region 3, resulting in a configuration where the origin of generation of the conduction electrons is suppressed.

The impurity density and the thickness of the first hetero semiconductor region 3 are appropriately adjusted so that the entire first hetero semiconductor region 3 do not become depleted when the positive electric potential applied to the second electrode 5 (cathode) is increased. In doing so, the conduction electrons are not directly supplied to the drift region 2 from the first electrode 4 that serves as a conduction-electron supplying source on the anode side. When the thickness of the remaining region, which remains undepleted, of the first hetero semiconductor region 3 is larger than a diffusion length of electrons in the first hetero semiconductor region 3, it is possible to further cut-off from the supply source of the electrons. Thereby, a leakage current characteristic significantly lower as compared to the Schottky junction diode and the conventional structure is provided in the first embodiment.

At this time, a reverse bias state is established also in the PN junction between the electric-field relaxation regions 6 and the drift region 2. However, since the leakage current is even smaller than in the heterojunction between the first hetero semiconductor region 3 and the drift region 2, the leakage current characteristic of the entire active region is not affected.

Next, regarding a resistance out of the reverse characteristics, the main region 103 of the active region has a high retention capability in the first place because of retention by a plurality of semiconductor materials rather than retention by a single semiconductor material. Even so, when the impurity density on the semiconductor material side of which band gap is narrow (in this case, this side corresponds to the side of the first hetero semiconductor region 3) is made higher than that of the drift region 2, the main region 103 of the active region can be imparted a higher retention capability. That is, this is made possible because the voltage applied between the cathode/anode can be allotted such that the voltage of the drift region 2 side, which has a higher voltage retention capability, is higher.

Thereafter, when the voltage applied between the cathode/anode is further increased, and thus, the resistance of the active region, that is, the avalanche breakdown voltage of the active region is reached, an additional characteristic is demonstrated in the first embodiment. That is, by lowering the impurity density of the first hetero semiconductor region 3 than a predetermined value, the avalanche breakdown can be caused in any place on a surface where the first hetero semiconductor region 3 and the drift region 2 contact at equal timing of or earlier than in the drift region 2 that contacts the electric-field relaxation regions 6 formed in outer peripheral ends of the active region, and thus, a higher avalanche resistance can be demonstrated. The reason for that is as follows.

It is known that 4H—SiC configuring the drift region 2 shown in the first embodiment has a high dielectric breakdown field characteristic. For example, according to the Table 2.2 on Page 11 in "Technology of Semiconductor SiC and its Application (by Hiroyuki Matsunami, published by the Nikkan Kogyo Shimbun)", the dielectric breakdown electric field of 4H—SiC is about 2.8 MV/cm.

On the other hand, regarding Si configuring the first hetero semiconductor region 3 (in the first embodiment, the first hetero semiconductor region 3 is comprised of polycrystalline silicon. However, for convenience of understanding, physical data of single crystal Si is used for explanations), according to the FIG. 29 on Page 103 in "Physics of Semiconductor Device (by S. M. Sze, published by Wiley)", the magnitude of the dielectric breakdown electric field varies depending on the magnitude of the impurity density introduced in Si. For example, in a case where the impurity density is $10^{17}$ cm$^{-3}$ shown in the first embodiment, the dielectric breakdown electric field is about 0.6 MV/cm. On the other hand, in a case where the impurity density is $10^{19}$ cm$^{-3}$, for example (although this is not shown in the FIG. 29 of the reference document, the following can be said on the assumption that a wavelength is extrapolated from its characteristic), the dielectric breakdown electric field is probably about 3 MV/cm.

Figure 3:
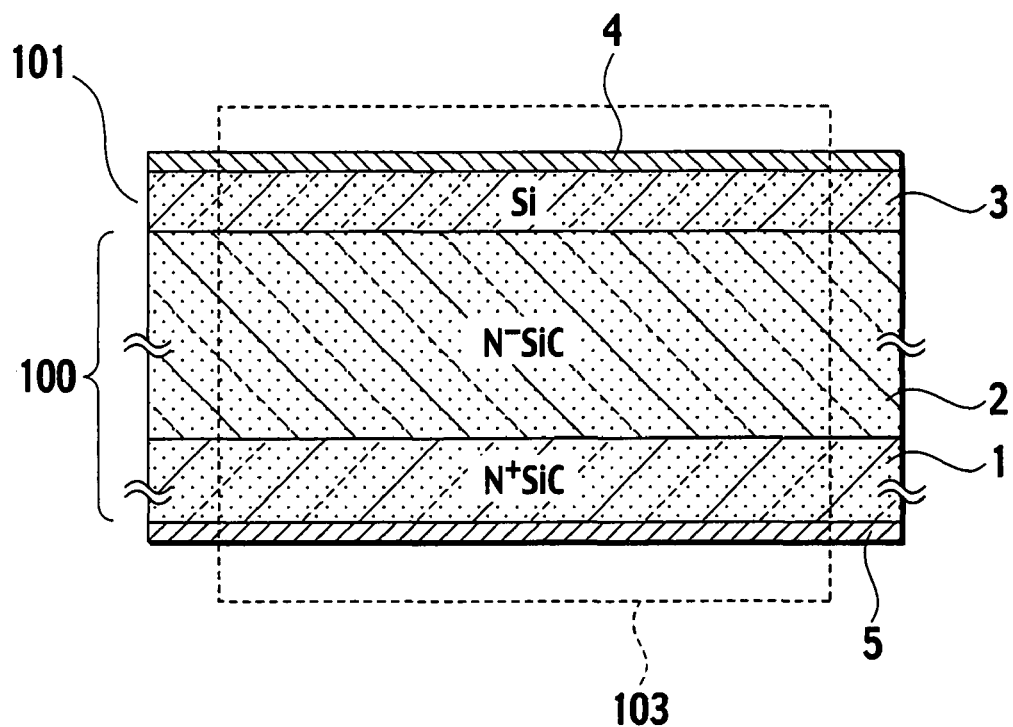
FIG. 3 is an enlarged view of a main region of an active region shown in FIG. 1.

Based on such data, as shown in FIG. 3, when only the main region 103 of the active region in FIG. 1 is considered, the heterojunction interface has the highest electric field in a portion in which formed is a planarized heterojunction where the drift region 2 and the first hetero semiconductor region 3 face. A comparison is made by using the data found in the reference document. When the impurity density of the first hetero semiconductor region 3 of about $10^{19}$ cm$^{-3}$ is used as a reference, it can be supposed that at least in the planarized portion, the avalanche breakdown occurs on the side of Si (the first hetero semiconductor region 3) when the impurity density falls below the reference, and the avalanche breakdown occurs on the side of 4H—SiC (drift region 2) when the impurity density exceeds the reference. Accordingly, it is understood that at least in the planarized portion, the avalanche breakdown occurs in the entire first hetero semiconductor region 3 in the configuration shown in the first embodiment where the impurity density of the first hetero semiconductor region 3 is $10^{17}$ cm$^{-3}$.

In FIG. 1, the electric-field relaxation regions 6 formed so as to correspond to end portions of the first hetero semiconductor region 3 relax an electric field concentration toward the end portions of the first hetero semiconductor region 3. That is, this is due to the fact that in a portion where the drift region 2 and the electric-field relaxation regions 6 contact, an electric potential distribution occurs between the drift region 2 and the electric-field relaxation regions 6, and almost no electric potential distribution occurs in the end portions of the first hetero semiconductor region 3. Accordingly, in the first hetero semiconductor region 3, the electric potential distribution is spread on the planarized junction surface contacting the drift region 2.

On the other hand, as for the drift region 2, an electric field concentration is relaxed in a portion that contacts the electric-field relaxation regions 6 as compared to a case where the electric-field relaxation regions 6 are not formed. However, this portion has a high electric field distribution as compared to the planarized portion that contacts the first hetero semiconductor region 3. This allows the voltage applied between the cathode/anode to reach a predetermined value, and as a result, the avalanche breakdown occurs in the first hetero semiconductor region 3 that contacts the drift region 2 or in neighboring areas of the drift region 2 that contacts the electric-field relaxation regions 6.

At this time, as explained above, by adjusting the impurity density of the first hetero semiconductor region 3, it becomes possible to control the dielectric breakdown electric field of the first hetero semiconductor region 3. There by, with in the planarized first hetero semiconductor region 3 that contacts the drift region 2, the impurity density of the first hetero semiconductor region 3 can be adjusted and set such that the avalanche breakdown occurs at equal timing of or earlier than in a portion of the drift region 2, which contacts the electric-field relaxation regions 6 and has the highest electric field. As a result, it becomes possible to control such that the avalanche breakdown occurs in the planarized first hetero semiconductor region 3 that contacts the drift region 2.

Such a characteristic technique permits occurrence of the avalanche breakdown on the entire junction surface of the heterojunction portion that contacts the drift region 2 in also the semiconductor device, including end portions, configured as shown in FIG. 1 to thereby allow the passing of a breakdown current in a wide range. Thus, it is possible to enhance a breakdown withstand capability to withstand until destruction occurs due to the avalanche breakdown, that is, the avalanche resistance.

On the other hand, in the Schottky junction diode, it is principally difficult to obtain such high avalanche resistance. The reason for that is explained by using a hypothetical case where a portion of the first hetero semiconductor region 3 is formed of a Schottky electrode in FIG. 3. An electric potential distribution corresponding to the voltage applied between the first electrode 4 (anode) and the second electrode 5 (cathode) does not occur in the Schottky electrode, and the electric potential distribution spreads almost only on the side of the drift region 2.

As explained above, the concentration of the electric field in the junction ends can be significantly relaxed as compared to a case where the electric-field relaxation regions 6 are not formed. However, the drift region 2 always has a high electric field distribution as compared to the electric field distribution in the junction portion formed in the planarized portion. Thus, in the Schottky junction diode, the avalanche breakdown occurs in the drift region 2 that contacts the electric-field relaxation regions 6 on the end portions earlier in the planarized portion that contacts the drift region 2. Due to this reason, in the Schottky junction diode, generally, the avalanche breakdown locally occurs in a certain point of a drain region indicative of the maximum electric field at neighboring areas of the outer peripheral ends of the junction. This results in a significant limitation on the improvement of the avalanche resistance. This can be also true of the conventional structure in which the heterojunction diode is merely formed.

Thus, in the first embodiment, unlike the conventional structure where the avalanche breakdown locally occurs at the neighboring areas of the end portions, the avalanche breakdown occurs on the entire junction surface where the first hetero semiconductor region 3 and the drift region 2 contact, and this allows the breakdown current to pass, thereby enhancing the avalanche resistance.

(First and Second Modifications)

While explanations have been made by using FIG. 1 as the first embodiment, the semiconductor device can have a breakdown voltage structure such as a guard ring at an area outward of the electric-field relaxation regions 6 of FIG. 1. In addition to the electric-field relaxation regions 6 arranged at the neighboring areas, an electric-field relaxation structure such as a first modification shown in a cross-sectional view of FIG. 4, which is a modification of the first embodiment, or a second modification shown in a cross-sectional view of FIG. 5, which is a modification of the first embodiment, can be provided, for example. Also in this case, the similar effect can be obtained as in the case of the configuration shown in FIG. 1.

Figure 4:
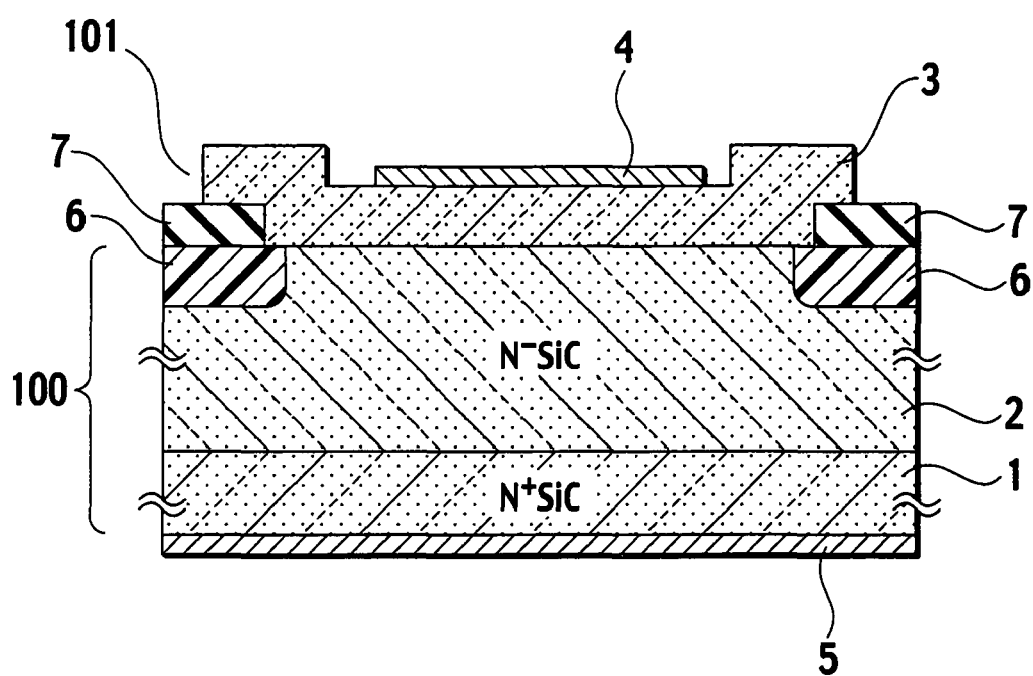
FIG. 4 is a cross-sectional view showing a configuration of a semiconductor device according to a first modification of the first embodiment.

FIG. 4 shows a case where the end portions of the first hetero semiconductor region 3 are surmounted on interlayer dielectrics 7 comprised of $SiO_2$, for example, stacked and formed on the end portions of the drift region 2. The formation of the end portions of the first hetero semiconductor region 3 on the interlayer dielectrics 7 provides various characteristics. The effect of an electric-field relaxation is obtained, and an etching damage is not easily incurred in the drift region 2 when the first hetero semiconductor region 3 is etched by dry etching, or the like. FIG. 4 shows a case where the interlayer dielectrics 7 are formed together with the electric-field relaxation regions 6. However, the semiconductor device can be configured such that only the interlayer dielectrics 7 exist.

Figure 5:
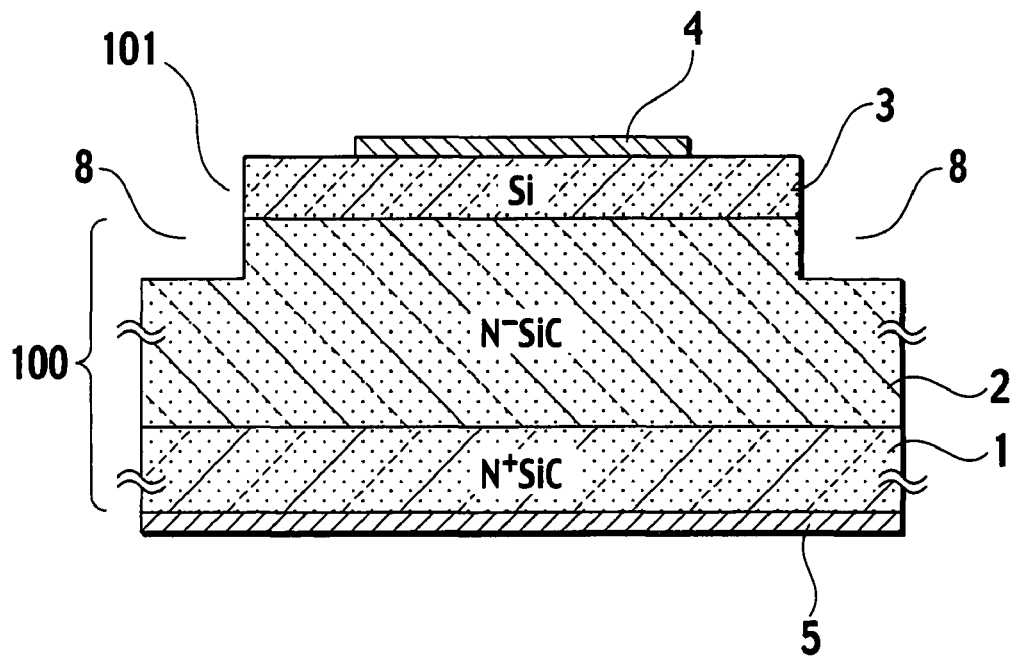
FIG. 5 is a cross-sectional view showing a configuration of a semiconductor device according to a second modification of the first embodiment.

FIG. 5 shows a configuration in which adopted is a mesa structure formed with digging portions 8 formed by digging the end portions of the first hetero semiconductor region 3 and the drift region 2. With a structure like this, the field-electric relaxation of the junction ends can be also provided. In addition to the structure of FIG. 5, the electric-field relaxation regions 6 shown in FIG. 1 can be formed by being adjacent to the digging portions 8.

(Third and Fourth Modifications)

In FIG. 1 to FIG. 5, explanations have been given of a case where the second semiconductor region 101 is formed only of the first hetero semiconductor region 3 in which single conductivity type and impurity density are used. However, as shown in a third modification shown in a cross-sectional view of FIG. 6, which is a modification of the first embodiment, or a fourth modification shown in a cross-sectional view of FIG. 7, which is a modification of the first embodiment, for example, second hetero semiconductor regions 9 different in conductivity type and impurity density from the first hetero semiconductor regions 3 can be provided. In the third modification shown in FIG. 6, the first hetero semiconductor regions 3 and the second hetero semiconductor regions 9 are formed one after another in a direction orthogonal to a direction in which the first semiconductor region 100 and the second semiconductor region 101 are stacked. On the other hand, in the fourth modification shown in FIG. 7, the second semiconductor region 101 is formed such that the second hetero semiconductor region 9 is stacked on the first hetero semiconductor region 3.

The conductivity type of the second hetero semiconductor region 9 can be either P-type or N-type, and the impurity density thereof can be either larger or smaller than that of the first hetero semiconductor region 3. However, in FIGS. 6 and 7, when the second hetero semiconductor region 9 is P-type in particular, and is higher in impurity density than the first hetero semiconductor region 3, an additional effect can be obtained as compared to the first embodiment.

Figure 6:
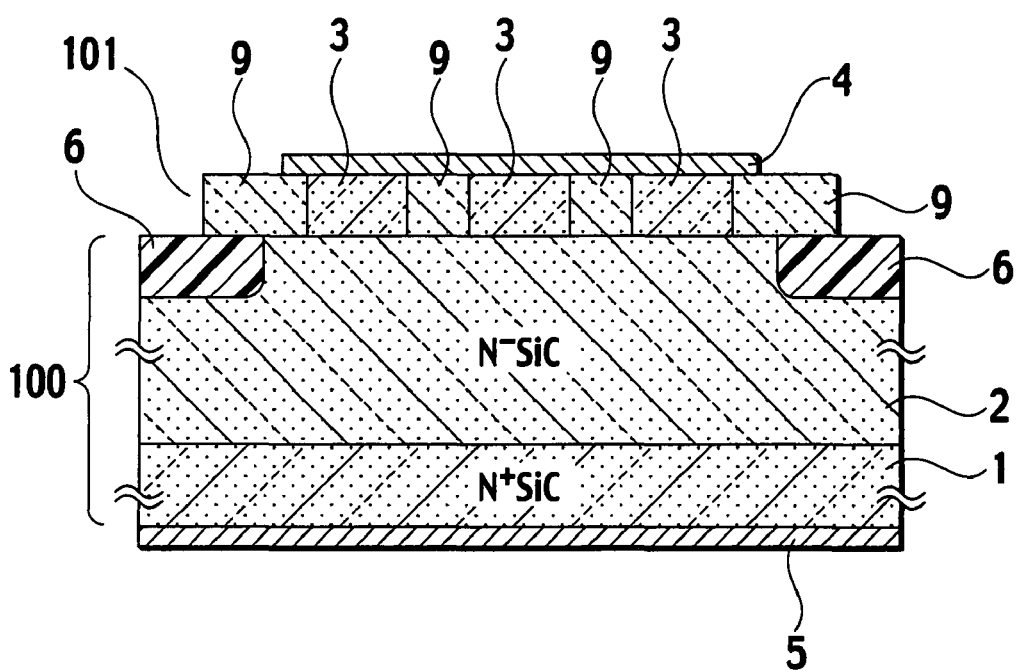
FIG. 6 is a cross-sectional view showing a configuration of a semiconductor device according to a third modification of the first embodiment.

That is, in the configuration shown in FIG. 6, the resistance within the second semiconductor region 101 can be reduced while having a breakdown voltage on the same level as that of the configuration shown in FIG. 1. Further, when the impurity density of the second hetero semiconductor region 9 is so high as to ohmic contact with the anode electrode 4, the contact resistance therebetween can be also reduced. That is, an on-resistance at the time of forward direction conduction can be reduced. On the other hand, in the configuration shown in FIG. 7, the leakage current in a cutoff state can be reduced while having the on-resistance on the same level as the configuration shown in the first embodiment. This is due to the fact that on the junction interface between the drift region 2 and the second hetero semiconductor region 9 having a high P-type impurity density, a heterojunction barrier having a barrier higher than on the junction interface between the drift region 2 and the first hetero semiconductor region 3 is formed.

(Fifth and Sixth Modifications)

Figure 7:
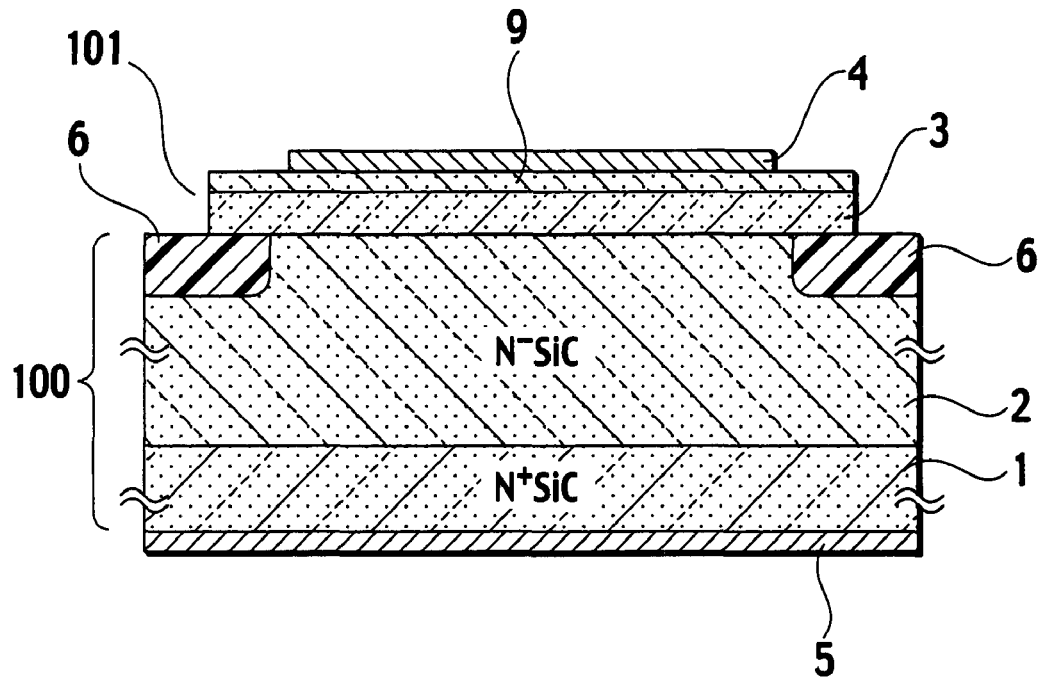
FIG. 7 is a cross-sectional view showing a configuration of a semiconductor device according to a fourth modification of the first embodiment.

In FIG. 7, an explanation has been given of a case where the first hetero semiconductor region 3 and the second hetero semiconductor region 9 are formed, as separate regions, within the second semiconductor region 101. However, as shown in a fifth modification shown in a cross-sectional view of FIG. 17, which is a modification of the fourth modification, or a sixth modification shown in a cross-sectional view of FIG. 18, which is a modification of the fourth modification, a configuration in which the second hetero semiconductor region 9 is deleted and a predetermined impurity density distribution is present in the first hetero semiconductor region 3 can be possible.

Figure 17:
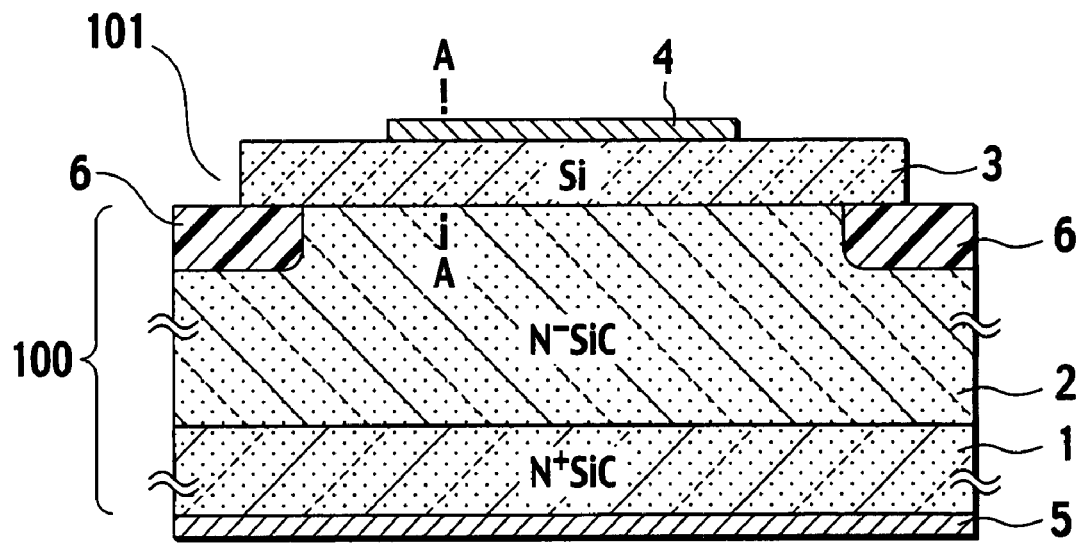
FIG. 17 is a cross-sectional view showing a configuration of a semiconductor device according to a fifth modification of the first embodiment.
Figure 19:
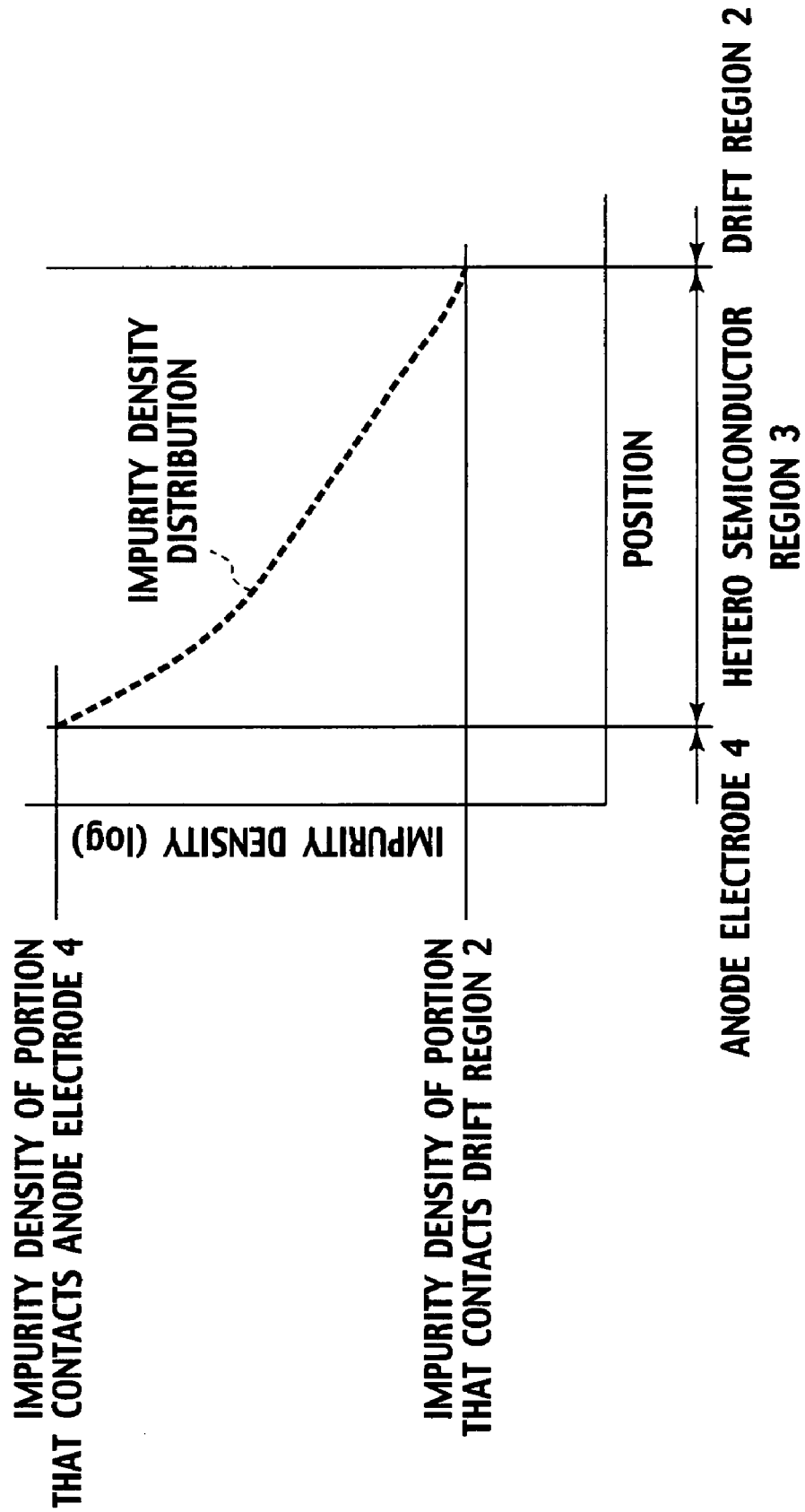
FIG. 19 is a graph showing an impurity density distribution along a line A-A in FIG. 17.

FIG. 17 is a cross-sectional view corresponding to FIG. 1, in which the impurity density within the first hetero semiconductor region 3 is structured to have a predetermined gradient. FIG. 19 shows an impurity density distribution of the first hetero semiconductor region 3 along a line A-A in FIG. 17. As shown in FIG. 19, in the structure in FIG. 17, the impurity density within the hetero semiconductor region 3 is distributed such that a portion, within the first hetero semiconductor region 3, that contacts the anode electrode 4 is high in impurity density and a portion that contacts the drift region 2 is low in impurity density. With this configuration, the second hetero semiconductor region 9 is deleted, and as a result, with the configuration in which only the first hetero semiconductor region 3 remains, the similar effect as in the case of the fourth modification can be achieved. This configuration can be easily achieved by using a manufacturing method described below. The manufacturing method is explained with reference to a process cross-sectional view of FIGS. 20A to 20C as an example.

Figure 20A:
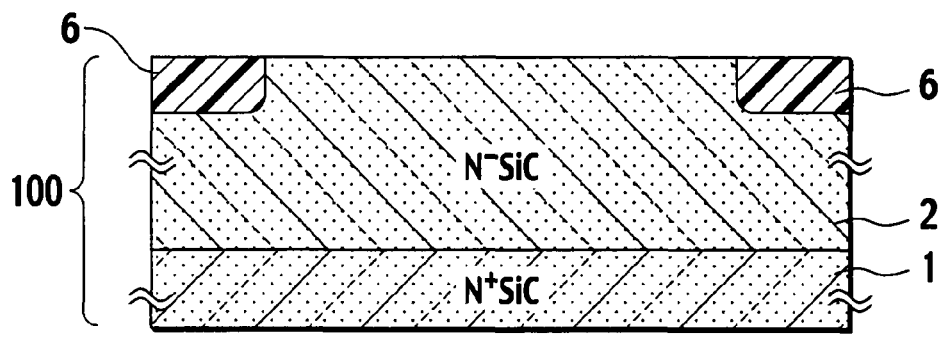
FIGS. 20A to 20C are process cross-sectional views showing a manufacturing method of the semiconductor device according to the fifth modification of the first embodiment.

Firstly, as shown in FIG. 20A, by using the first semiconductor region 100 comprised of an N-type silicon carbide semiconductor base substrate formed such that the N⁻-type drift region 2 is epitaxially grown on the N⁺-type substrate region 1, aluminum ions are selectively implanted into a predetermined drift region 2, for example, and thereafter, actively annealed to thereby form the P-type electric-field relaxation regions 6. Boron can be employed as an impurity used to form the electric-field relaxation regions 6. The electric-field relaxation regions 6 can be formed as high resistant regions in which to hold a breakdown voltage without activating the impurity, or formed of an insulating film such as an oxide film.

Figure 20B:
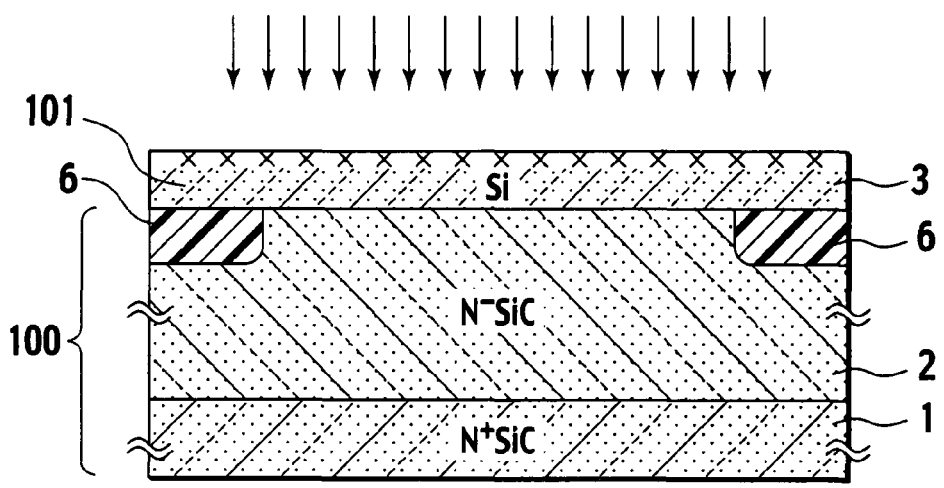

Next, as shown in FIG. 20B, a layer of the first hetero semiconductor region 3 comprised of polycrystalline silicon formed by an LP-CVD method, for example, is stacked on the drift region 2. Thereafter, boron is doped by an ion-implantation method, for example, to form an implanted layer in a surface layer of the layer of the first hetero semiconductor region 3. The first hetero semiconductor region 3 can be formed by being stacked through an electron beam evaporation method or a sputtering method, and then, recrystallized by laser annealing or the like. Alternatively, the first hetero semiconductor region 3 can be formed of single crystal silicon heteroepitaxially grown by molecular beam epitaxy, for example.

In doping, the doping is not only performed on the surface layer, but can be also performed by multi-step implantation to previously form a concentration distribution. Other doping methods can be employed. In the present embodiment, explanations have been given of a case where ions are directly implanted to the layer of the first hetero semiconductor region 3. However, it is possible to use a method in which an oxide film of a predetermined thickness is formed on the layer of the first hetero semiconductor region 3, for example, and impurities are introduced via the oxide film.

Figure 20C:
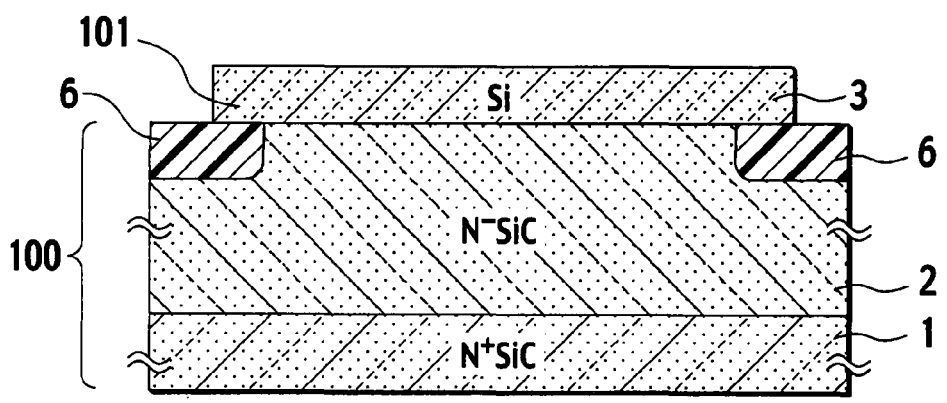

Next, as shown in FIG. 20C, a mask material is optionally formed by photolithography and etching, and by using reactive ion etching (dry etching), for example, the first hetero semiconductor region 3 is selectively removed by using the previously formed mask material as a mask thereby to form a predetermined shape. Other masks such as an oxide film mask and a nitride film can be used for the mask material. As the etching method, other methods such as wet etching, for example, can be used.

Subsequently, on the other main surface of the substrate region 1 that corresponds to a rear surface side, the second electrode 5 comprised of nickel (Ni), for example, is formed, and in order to obtain a good contact resistance on the rear surface, a heat treatment at about 600 to 1200° C., for example, is applied thereto. At this time, in the present embodiment, the boron ions simultaneously introduced in the first hetero semiconductor region 3 are impurity-activated so as to render P-type, and a predetermined impurity gradient is therein formed.

Finally, on the top surface side of the first hetero semiconductor region 3, titanium (Ti) and aluminum (Al) are stacked in this order to form the first electrode 4, whereby the semiconductor device shown in FIG. 17 is completed.

In an experiment conducted by the inventor(s), the first hetero semiconductor region 3 was formed of polycrystalline silicon with a thickness of about 0.5 µm, and boron ions were implanted in the first hetero semiconductor region 3 up to about 0.1 µm deep from the surface layer. With this state, a heat treatment was applied. The experiment yielded the result that when a heat treatment was applied at 950° C. for about 20 minutes, for example, the impurity distribution in the first hetero semiconductor region 3 was almost uniform. On the contrary, in a heat treatment at 900° C. for about 1 minute, for example, it was confirmed that a concentration gradient of about half a digit was formed between the surface layer and the drift region 2 side.

Accordingly, by optimally setting the thickness of the first hetero semiconductor region 3 and the conditions of the heat treatment, a desired impurity gradient can be obtained. Thus, the use of the present manufacturing method provides a desired impurity density in each region by a single manufacturing process.

The most ideal conditions for thus providing the gradient in the impurity distribution are set such that the impurity density on the side that contacts at least the drift region 2 of the first hetero semiconductor region 3 is equal to or less than an impurity density by which the avalanche breakdown occurs on the side of the first hetero semiconductor region 3 shown in the above FIG. 1, the impurity density on the side that contacts the first electrode 4 is equal to or more than the impurity density by which ohmic contact occurs, and the thickness of the first hetero semiconductor region 3 is the minimum.

Figure 18:
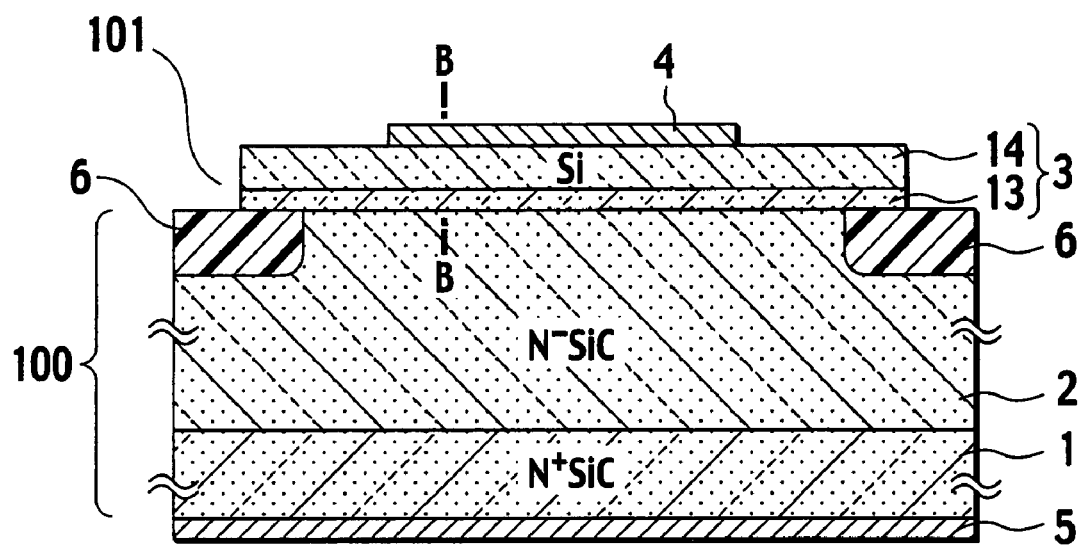
FIG. 18 is a cross-sectional view showing a configuration of a semiconductor device according to a sixth modification of the first embodiment.

Based on such a method, the use of the configuration of the sixth modification shown in FIG. 18 makes thin the thickness of the first hetero semiconductor region 3 and also provides a low on-resistance.

FIG. 18 is a cross-sectional view corresponding to FIG. 17, in which the first hetero semiconductor region 3 is formed of a plurality of semiconductor layers (a lower semiconductor layer 13 and an upper semiconductor layer 14), and similar to the configuration of FIG. 17, the impurity density is configured to have a predetermined gradient. FIG. 18 shows a case where the first hetero semiconductor region 3 is formed of two semiconductor layers. However, the first hetero semiconductor region 3 can be formed of three or more layers.

Figure 21:
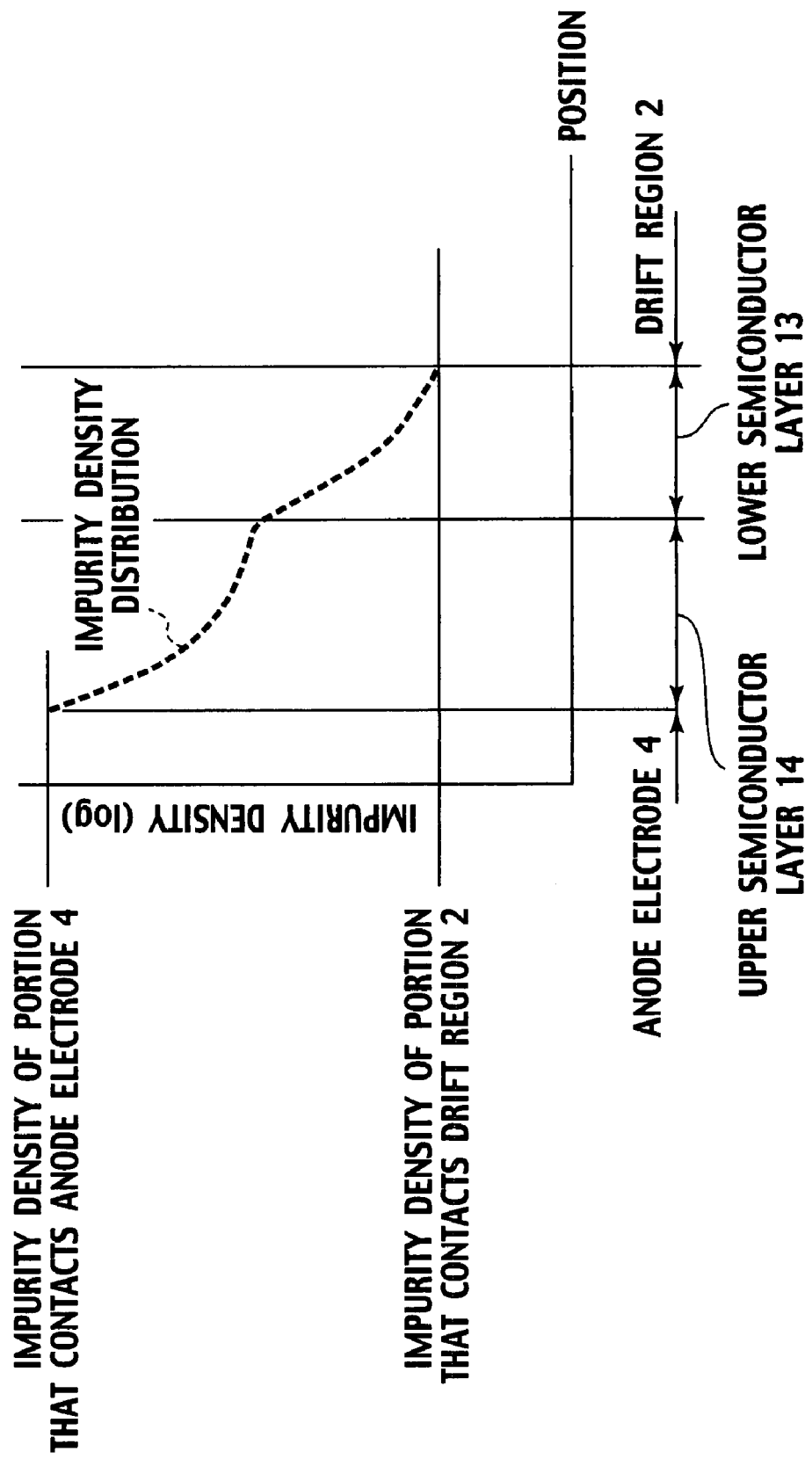
FIG. 21 is a graph showing an impurity density distribution along a line B-B in FIG. 17.

FIG. 21 shows an impurity density distribution of the first hetero semiconductor region 3 along a line B-B in FIG. 18. As shown in FIG. 21, in the configuration in FIGS. 20A to 20C, the impurity density within the first hetero semiconductor region 3 is distributed and formed such that in a portion that contacts the anode electrode 4 within the first hetero semiconductor region 3, the impurity density is high, and on the other hand, in a portion that contacts the drift region 2, the impurity density is low as compared to the portion that contacts the anode electrode 4.

In a boundary portion between the lower semiconductor layer 13 and the upper semiconductor layer 14, the gradient of the impurity is discontinuous, and a density difference of the impurity in terms of the entire first hetero semiconductor region 3 can be made larger than that of the configuration shown in FIG. 17. The configuration like this provides an effect similar to that of the fifth modification, and in addition, makes much thinner the thickness of the first hetero semiconductor region 3 as compared to that of the fifth modification, and reduces the on-resistance as well.

This configuration can be easily achieved by using a manufacturing method shown below. The manufacturing method is explained with reference to a process cross-sectional view of FIGS. 22A to 22C as an example.

Figure 22A:
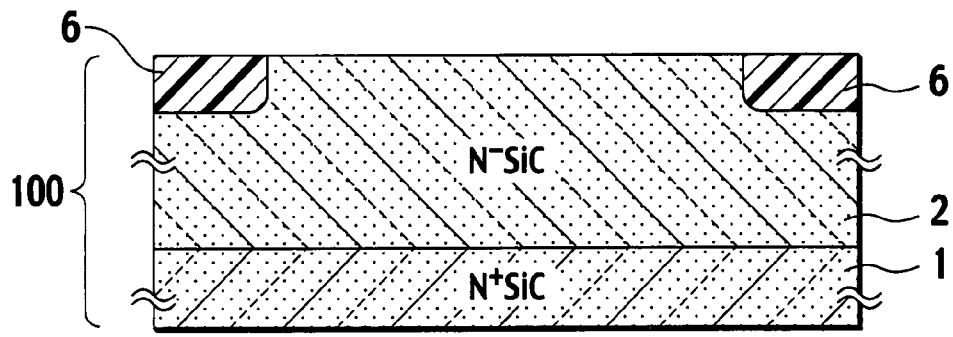
FIGS. 22A to 22C are process cross-sectional views showing a manufacturing method of the semiconductor device according to the fifth modification of the first embodiment.

Firstly, as shown in FIG. 22A, by using the first semiconductor region 100 comprised of an N-type silicon carbide semiconductor base substrate formed such that the N⁻-type drift region 2 is epitaxially grown on the N⁺-type substrate region 1, aluminum ions are selectively implanted into a predetermined drift region 2, for example, and thereafter, actively annealed to thereby form the P-type electric-field relaxation regions 6. Boron can be used as an impurity to form the electric-field relaxation regions 6. The electric-field relaxation regions 6 can be formed as high resistant regions in which to hold a breakdown voltage without activating the impurity, or formed of an insulating film such as an oxide film.

Figure 22B:
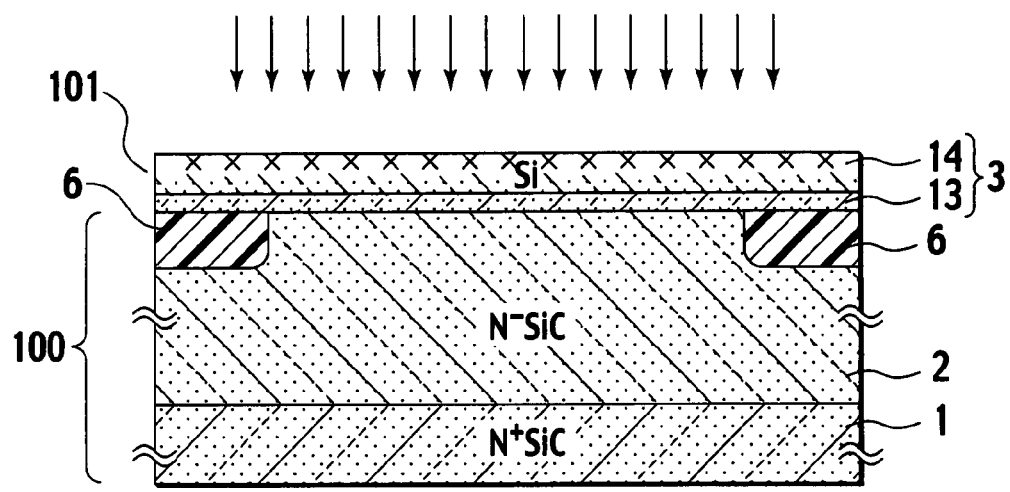

As shown in FIG. 22B, the lower semiconductor layer 13 comprised of polycrystalline silicon formed by an LP-CVD method, for example, is stacked on the drift region 2, and subsequently, on the lower semiconductor layer 13, the upper semiconductor layer 14 comprised of polycrystalline silicon formed by the LP-CVD method, for example, is stacked. At this time, the crystalline alignment of polycrystalline silicon formed between the lower semiconductor layer 13 and the upper semiconductor layer 14 are preferably at least discontinuous. For example, when the lower semiconductor layer 13 and the upper semiconductor layer 14 are formed, formation temperatures can be made different so that the crystalline alignment is made discontinuous, or the both layers 13 and 14 can be separately formed.

Thereafter, boron is doped by an ion-implantation method, for example, to form an implanted layer in a surface layer of the upper semiconductor layer 14 of the layer of the first hetero semiconductor region 3. The lower semiconductor layer 13 and the upper semiconductor layer 14 can be formed by being stacked through an electron beam evaporation method or a sputtering method, and then, recrystallized by laser annealing or the like. Alternatively, these layers 13 and 14 can be formed of single crystal silicon heteroepitaxially grown by molecular beam epitaxy, for example. In doping, the doping is not only applied to the surface layer, but also can be performed by multi-step implantation to previously form a concentration distribution. Other doping methods can be also employed. In the present embodiment, a case where the ions are directly implanted into the upper semiconductor layer 13 is shown. However, it is possible to employ a method in which an oxide film or the like of a predetermined thickness is formed on the layer of the first hetero semiconductor region 3, and thereafter, impurities are introduced via the oxide film.

Figure 22C:
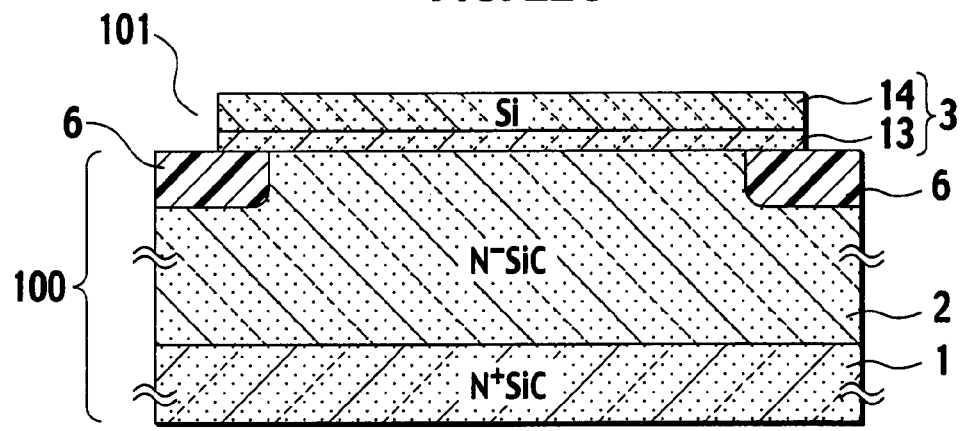

Next, as shown in FIG. 22C, a mask material is optionally formed by photolithography and etching, and by using reactive ion etching (dry etching), for example, the first hetero semiconductor region 3 is selectively removed by using the previously formed mask material as a mask to thereby form a predetermined shape. Other masks such as an oxide film mask and a nitride film can be used for the mask material. As the etching method, other methods such as wet etching, for example, can be used.

Subsequently, on the other main surface of the substrate region 1 that corresponds to a rear surface side, the second electrode 5 comprised of nickel (Ni), for example, is formed, and in order to obtain a good contact resistance on the rear surface, a heat treatment at about 600 to 1200° C., for example, is applied thereto. At this time, in the present embodiment, the boron ions simultaneously introduced in the upper semiconductor layer 14 of the first hetero semiconductor region 3 are impurity-activated so as to render P-type, and a predetermined impurity gradient is therein formed.

Finally, on the top surface side of the upper semiconductor layer 14 of the first hetero semiconductor region 3, the first electrode 4 is formed by stacking titanium (Ti) and aluminum (Al) in this order, whereby the semiconductor device shown in FIG. 18 can be completed.

In an experiment conducted by the inventor(s), the first hetero semiconductor region 3 was formed of polycrystalline silicon with a thickness of about 0.5 μm, and boron ions were implanted in the first hetero semiconductor region 3 up to about 0.1 μm deep from the surface layer. With this state, a heat treatment was applied. The experiment yielded the result that when a heat treatment was applied at 950° C. for about 20 minutes, for example, the impurity distribution in the first hetero semiconductor region 3 was almost uniform. In contrary, in a heat treatment at 900° C. for about 1 minute, for example, it was confirmed that a concentration gradient of about half a digit was formed between the surface layer and the drift region 2 side.

As apparent from the above, when the thickness of the first hetero semiconductor region 3 and the conditions for the heat treatment are optimally set, a desired impurity gradient can be obtained. Thus, the use of the present manufacturing method provides a desired impurity density in each region of a single manufacturing process.

Thus, the semiconductor devices of the fifth modification shown in the FIG. 17 and the sixth modification shown in the FIG. 18 can be easily achieved by ingeniously applying the conventionally-known semiconductor manufacturing technique.

(Seventh and Eighth Modifications)

In the modifications and the embodiment explained with reference to FIGS. 1 to 7 and FIGS. 17 to 22, explanations have been given of the configuration where only the heterojunction diode is formed between the first electrode 4 and the second electrode 5. However, as shown in a seventh modification in a cross-sectional view of FIG. 8, which is a modification of the first embodiment, a structure where a Schottky junction diode and the heterojunction diode of the first embodiment are mixed, or as shown in an eighth modification in a cross-sectional view of FIG. 9, which is a modification of the first embodiment, a structure where a Schottky junction diode and the heterojunction diode of the first embodiment are mixed can be possible.

Figure 8:
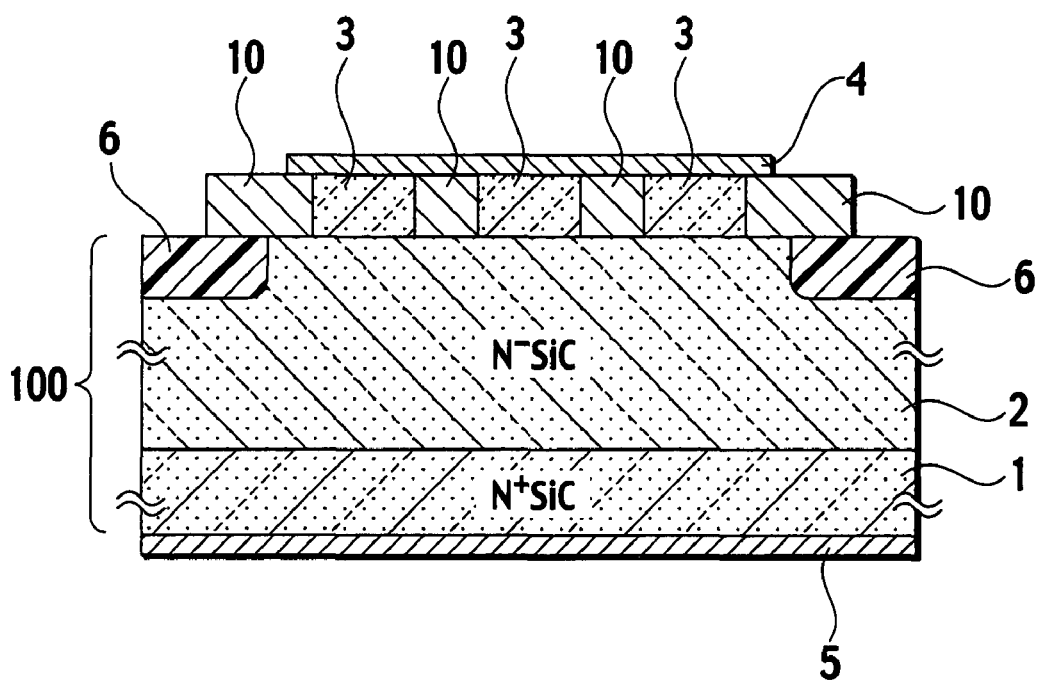
FIG. 8 is a cross-sectional view showing a configuration of a semiconductor device according to a seventh modification of the first embodiment.

FIG. 8 shows a case where the first electrode 4 of the heterojunction diode and Schottky electrode regions 10 of the Schottky junction diode are separately formed in different regions. On the other hand, FIG. 9 shows a case where the Schottky electrode region 10 serves also as the first electrode 4.

Figure 9:
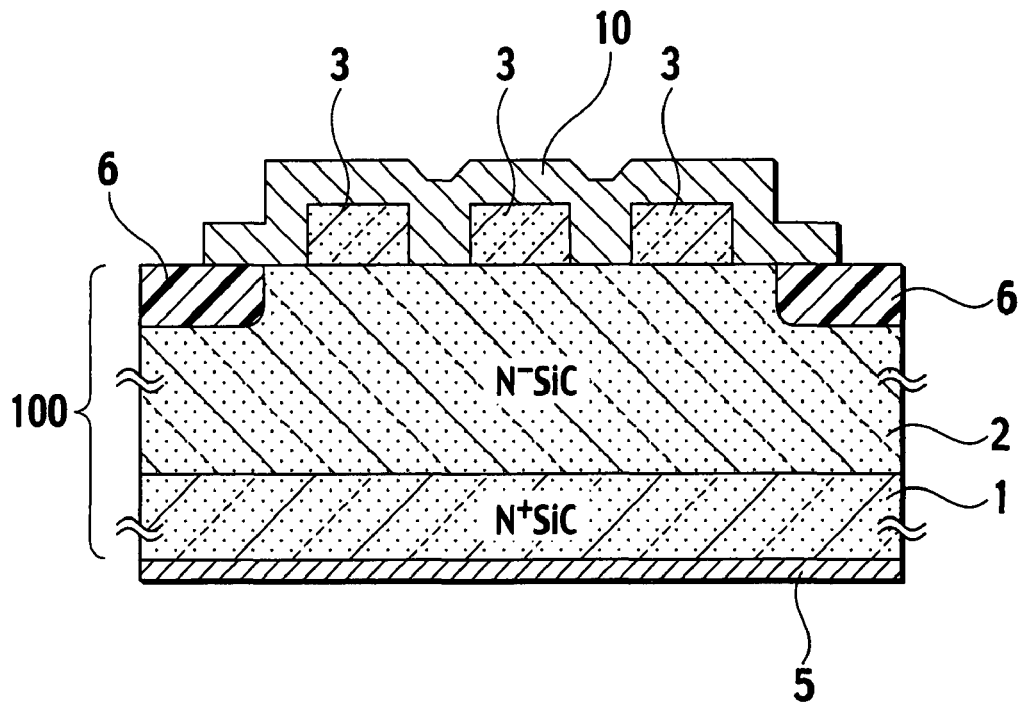
FIG. 9 is a cross-sectional view showing a configuration of a semiconductor device according to an eighth modification of the first embodiment.

As a material of the Schottky electrode region 10 shown in FIG. 8 and FIG. 9, an electrode material that causes the avalanche breakdown in the first hetero semiconductor region 3 can be used. As shown in FIG. 8 and FIG. 9, end portions of the first hetero semiconductor region 3 do not necessarily contact the electric-field relaxation regions 6. For example, when the outer periphery is surrounded by the Schottky electrode regions 10, the electric field distribution is almost uniform also in the end portions of the first hetero semiconductor regions 3. Thereby, the avalanche breakdown occurs on the entire junction surface between the drift region 2 and the first hetero semiconductor region 3, so that a high avalanche resistance can be obtained.

(Ninth and Tenth Modifications)

Figure 10:
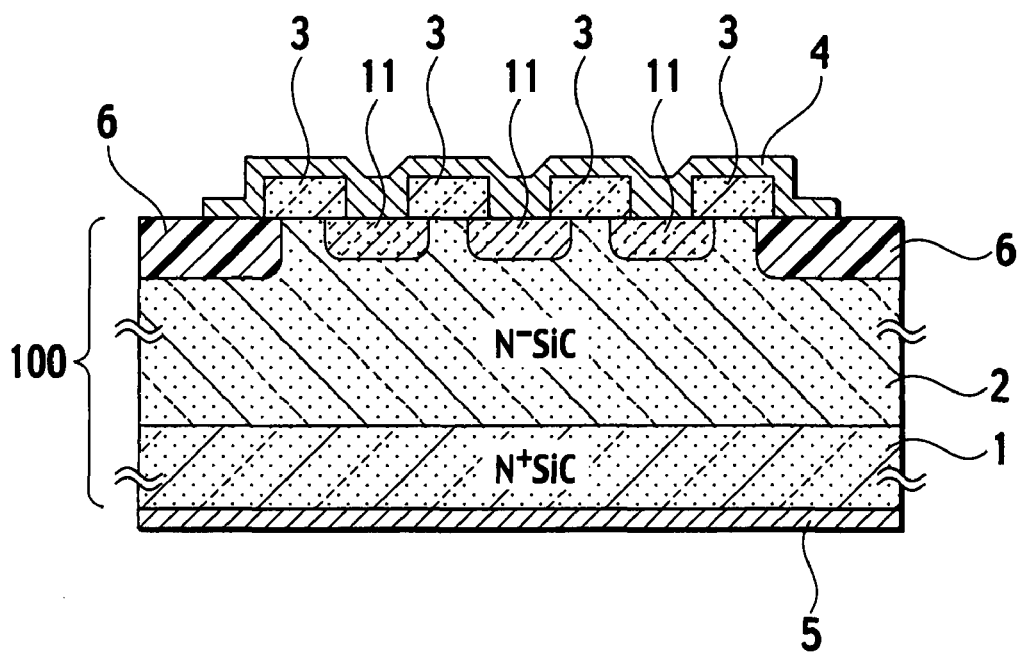
FIG. 10 is a cross-sectional view showing a configuration of a semiconductor device according to a ninth modification of the first embodiment.
Figure 11:
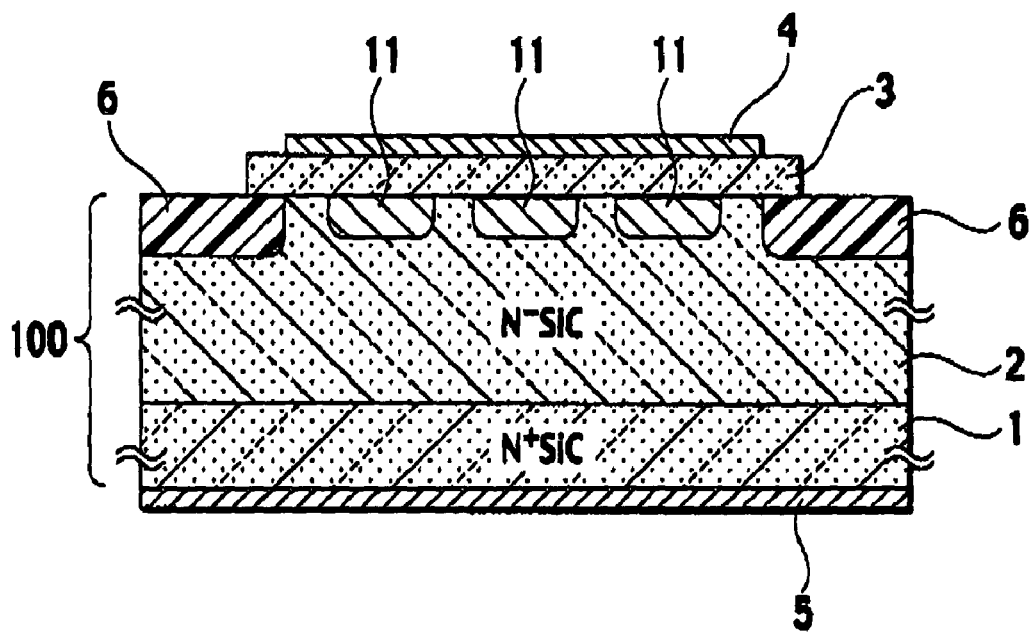
FIG. 11 is a cross-sectional view showing a configuration of a semiconductor device according to a tenth modification of the first embodiment.

In a ninth modification shown in a cross-sectional view of FIG. 10, which is a modification of the first embodiment, shown is a configuration in which the first hetero semiconductor regions 3 are discretely formed, P-type regions 11 are formed in the drift region 2 between the first hetero semiconductor regions 3, and the P-type regions 11 are directly connected to the first electrode 4. FIG. 11 is a cross-sectional view showing a tenth modification of the first embodiment. There is shown a configuration in which the P-type regions 11 are discretely formed in the drift region 2, which are arranged additionally to the configuration shown in FIG. 7, and the P-type regions 11 are connected via the first hetero semiconductor region 3 to the first electrode 4. In the P-type regions 11 shown in FIGS. 10 and 11, the impurity density and the depth are set such that the avalanche breakdown occurs in the first hetero semiconductor region 3.

In FIGS. 10 and 11, an explanation is given of a case where the P-type regions 11 and the electric-field relaxation regions 6 differ in depth. However, the impurity density and the depth thereof can be equal. The end portions of the first hetero semiconductor region 3 do not necessarily contact the electric-field relaxation regions 6. For example, when the outer periphery is surrounded by the P-type regions 11, almost no electric field is concentrated in the end portions of the first hetero semiconductor region 3. Thus, the avalanche breakdown occurs on the entire junction surface between the drift region 2 and the first hetero semiconductor region 3, so that a high avalanche resistance can be obtained.

Anyone of the configurations shown in FIG. 8 to FIG. 11 provides the above specific effect as long as the configuration in which the avalanche breakdown occurs in the first hetero semiconductor region 3 is included.

Figure 12:
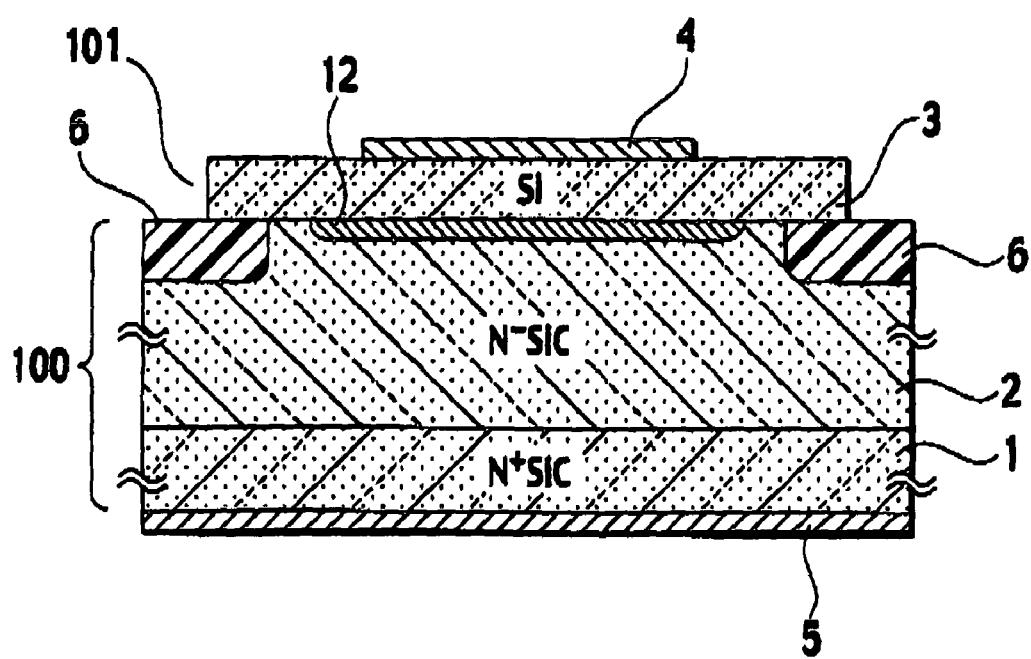
FIG. 12 is a cross-sectional view showing a configuration of a semiconductor device according to an eleventh modification of the first embodiment.

In the configurations shown in FIG. 1 to FIG. 11, explanations have been given of the configuration in which the impurity density within the first hetero semiconductor region 3 is a predetermined value, and the avalanche breakdown occurs. However, as shown in an eleventh modification in a cross-sectional view of FIG. 12, which is a modification of the first embodiment, a high electric field region 12 having a higher impurity density than the drift region 2 and more easily becoming a higher electric field than the surrounding areas, for example, can be formed with in the drift region 2 that contacts the first hetero semiconductor region 3. In such a configuration, a higher electric field occurs in the high electric field region 12 as compared to at least the outer peripheral ends of the active region. Thus, the avalanche breakdown can be caused at the equal timing of or earlier than the outer peripheral ends in this region, and the similar effect can be obtained irrespective of the impurity density of the first hetero semiconductor region 3.

As explained above, in the first embodiment, the fact that when the impurity density of the first hetero semiconductor region 3 is adjusted, the dielectric breakdown electric field within the first hetero semiconductor region 3 can be controlled is focused, and the impurity density of the first hetero semiconductor region 3 is set to equal to or less than a predetermined value. Thus, in the main region 103 of the active region, the avalanche breakdown occurs at equal timing of or earlier than in the surrounding areas, such as end portions, of the drift region 2, in which the electric field reaches the maximum. Thereby, unlike the conventional structure where the avalanche breakdown locally occurs in areas surrounding the end portions, the avalanche breakdown occurs almost uniformly on the entire junction surface that contacts the drift region 2. Thus, the avalanche resistance can be enhanced.

Second Embodiment

Figure 13:
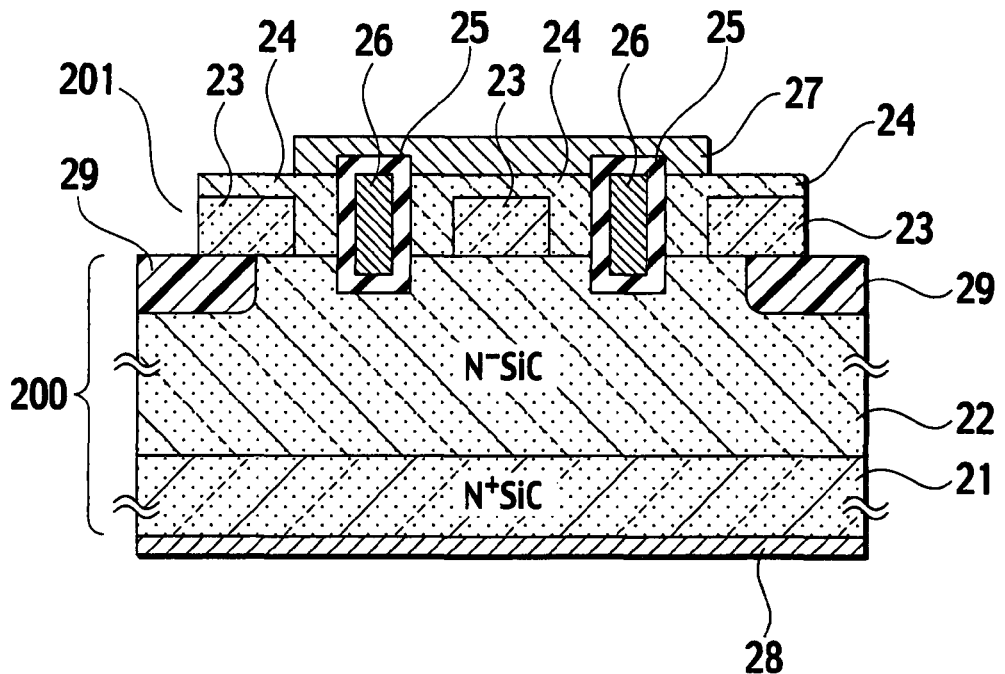
FIG. 13 is a cross-sectional view showing a configuration of a semiconductor device according to a second embodiment of the present invention.

FIG. 13 is a cross-sectional view showing the configuration of a semiconductor device according to a second embodiment of the present invention. A characteristic of the second embodiment shown in FIG. 13 is that the heterojunction diode having a high avalanche resistance, explained in the first embodiment including the first to eleventh modifications, is applied to a portion of a transistor.

In FIG. 13, the semiconductor device of the second embodiment is configured such that an $N^-$-type drift region 22 is formed on an $N^+$-type substrate region 21 of which the polytype of silicon carbide is 4H, for example; and first hetero semiconductor regions 23 comprised of P-type polycrystalline silicon and second hetero semiconductor regions 24 comprised of N-type polycrystalline silicon are formed so as to contact a main surface that opposes the junction surface, of the drift region 22, with the substrate 21.

A junction between the drift region 22, and the first and second hetero semiconductor regions 23 and 24 is formed by heterojunction comprised of a material of which band gap of the polycrystalline silicon is different from that of silicon carbide, and on the junction interface, an energetic barrier exists. Gate electrodes 26 formed so as to contact, via gate insulating films 25 comprised of a silicon oxide film, for example, the junction surface between the second hetero semiconductor region 24 and the drift region 22; a source electrode 27 formed so as to be connected to the second hetero semiconductor region 24; and a drain electrode 28 formed so as to be connected to the substrate region 1 are formed, respectively. Outer peripheral ends of the active region are formed with P-type electric-field relaxation regions 29, for example.

As shown in FIG. 13, the second embodiment is configured such that grooves are formed in the drift region 22 and the gate electrodes 26 are formed and buried in the grooves. However, a so-called planar configuration where no grooves are formed can be possible. Alternatively, in the second embodiment, the first hetero semiconductor regions 23 and the second hetero semiconductor region 24 are formed on the drift region 22. However, the first hetero semiconductor regions 23 and the second hetero semiconductor region 24 can be formed such that grooves are formed in predetermined regions of the drift region 22, for example, and these regions 23 and 24 are buried in the grooves.

Figure 14:
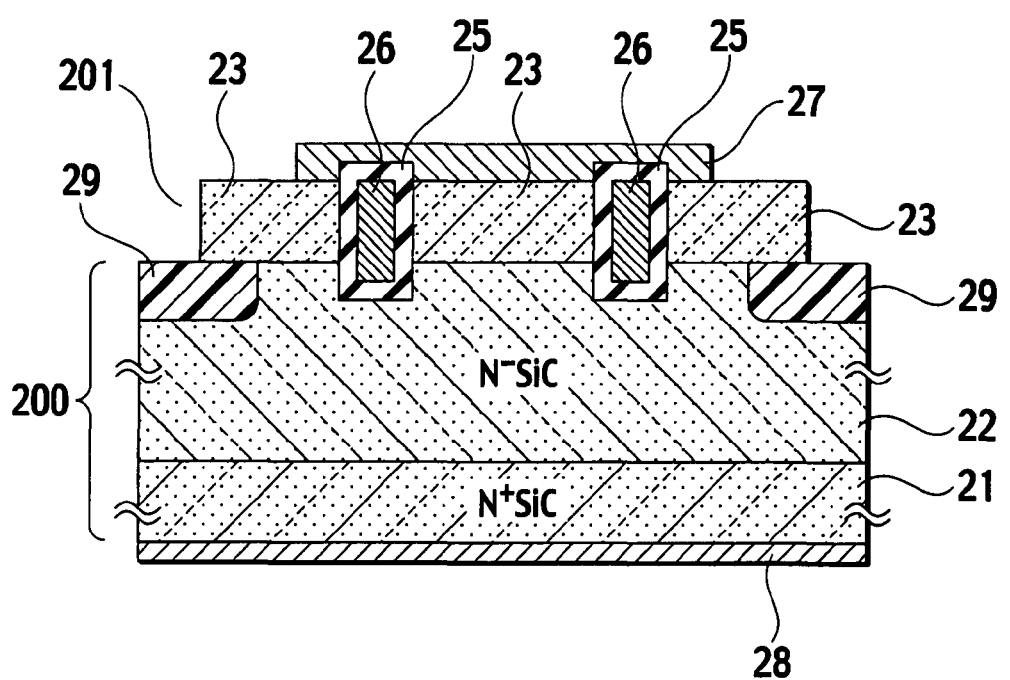
FIG. 14 is a cross-sectional view showing a configuration of a semiconductor device according to a first modification of the second embodiment.

FIG. 13 shows a configuration in which the gate electrodes 26 and the second hetero semiconductor region 24 are contacted via the gate insulating films 25. However, as shown in FIG. 14, which is a modification of the second embodiment, the gate electrodes 26 and the first hetero semiconductor region 23 are connected via the gate insulating films 25, and the second hetero semiconductor region 24 needs not particularly be arranged.

In the second embodiment, shown is a configuration in which electric-field relaxation regions 29 are formed as structures formed in the outer peripheral ends of the active region. However, any configuration can be possible as long as a structure that can relax the electric field concentration of the outer peripheral ends is arranged.

An operation of the configuration shown in FIG. 13 is explained next.

An explanation is given of a case where the source electrode 27 is grounded, and a positive electric potential is applied to the drain electrode 28, for example.

First, when the gate electrodes 26 are ground electric potentials or negative electric potentials, for example, the cutoff state is held. This is due to the fact that on the heterojunction interface between the drift region 22, and the first and second hetero semiconductor regions 23 and 24, energetic barriers against conduction electrons are formed. At this time, as explained in the first embodiment, it is configured such that the leakage current is reduced when the carrier generated under a predetermined electric field becomes the dominant cause. Thus, this configuration provides various effects, that is, a higher cutoff characteristic can be held, and a temperature characteristic of the leakage current is very small as well.

Next, when a positive electric potential is applied to the gate electrodes 26 in order to change from the cutoff state to a conduction state, an electric field affects as far as the heterojunction interface that the second hetero semiconductor region 24 and the drift region 22 contact via the gate insulating film 25. Thus, accumulation layers of the conduction electrons are formed in the drift region 22 and the second hetero semiconductor regions 24 in the vicinity of the gate electrodes 26. That is, potentials on the side of the second hetero semiconductor regions 24 on the junction interface between the drift region 22 and the second hetero semiconductor regions 24 in the vicinity of the gate electrodes 26 are decreased, and the energetic barrier on the side of the drift region 22 becomes precipitous. Thus, it becomes possible for the conduction electrons to conduct through the energetic barrier.

Next, when the gate electrodes 26 are ground electric potentials once again in order to change from the conduction state to the cutoff state, an inversion state of the conduction electrons formed on the heterojunction interface between the drift region 22 and the second hetero semiconductor regions 24 is canceled, whereby the tunneling through the energetic barriers stops. As a result, a flow of the conduction electrons from the second hetero semiconductor regions 24 to the drift region 22 stops, and the conduction electrons present in the drift region 22 flows into the substrate region 21, thereby occurring depletion. Subsequently, a depletion layer spreads from the heterojunction portion onto the side of the drift region 22, resulting in the cutoff state.

At this time, when the device shown in FIG. 13 is used by connecting to a dielectric load circuit, such as a motor drive, a drain voltage increases while a current passes between the drain electrode 28 and the source electrode 27 at the time of changing to the cutoff state. Subsequently, when a parasitic inductance of a wiring or the like caused at the time of connecting to the dielectric load circuit raises the drain voltage to a predetermined value or higher, the avalanche breakdown occurs in the first hetero semiconductor regions 23.

In the second embodiment, due to its characteristic configuration, an avalanche breakdown voltage caused between the first hetero semiconductor regions 23 and the drift region 22 is equivalent to, or equal to or less than the avalanche breakdown voltage occurring between the drift region 22 and the electric-field relaxation regions 29 formed at the outer peripheral ends of the active region. Therefore, the avalanche breakdown occurs in a wide range even in the main active region other than the outer peripheral ends of the active region. Thus, a high avalanche resistance can be achieved.

On the other hand, the second embodiment can be implemented in a reverse conduction (a reflux operation) state where the source electrode 27 is grounded, and a negative electric potential is applied to the drain electrode 28, for example. For example, when the source electrode 27 and the gate electrodes 26 are ground electric potentials and a predetermined positive electric potential is applied to the drain electrode 28, the energetic barrier against the conduction electrons disappear, and the conduction electrons pass from the side of the drift region 22 to the side of the first and second hetero semiconductor regions 23 and 24, resulting in the reverse conduction state. At this time, the conduction is established only by the conduction electrons without implantation of electron holes. Thus, loss caused by a reverse recovery current at the time of a change from the reverse conduction state to the cutoff state can be minimized. The gate electrodes 26 can be used as control electrodes, without being grounded.

(Second and Third Modifications)

Thus, in the configuration shown in FIGS. 13 and 14, an explanation has been given of a case where the heterojunction diode having a high avalanche resistance explained in the first embodiment is applied to a portion of a switch that gate-drives the heterojunction portion, as an example. However, as shown in a second modification in a cross-sectional of FIG. 15, which is a modification of the second embodiment, and a third modification in a cross-sectional view of FIG. 16, which is a modification of the second embodiment, even when the semiconductor device is used as a reflux diode contained in a portion of a switch element, a similar effect can be obtained.

Figure 15:
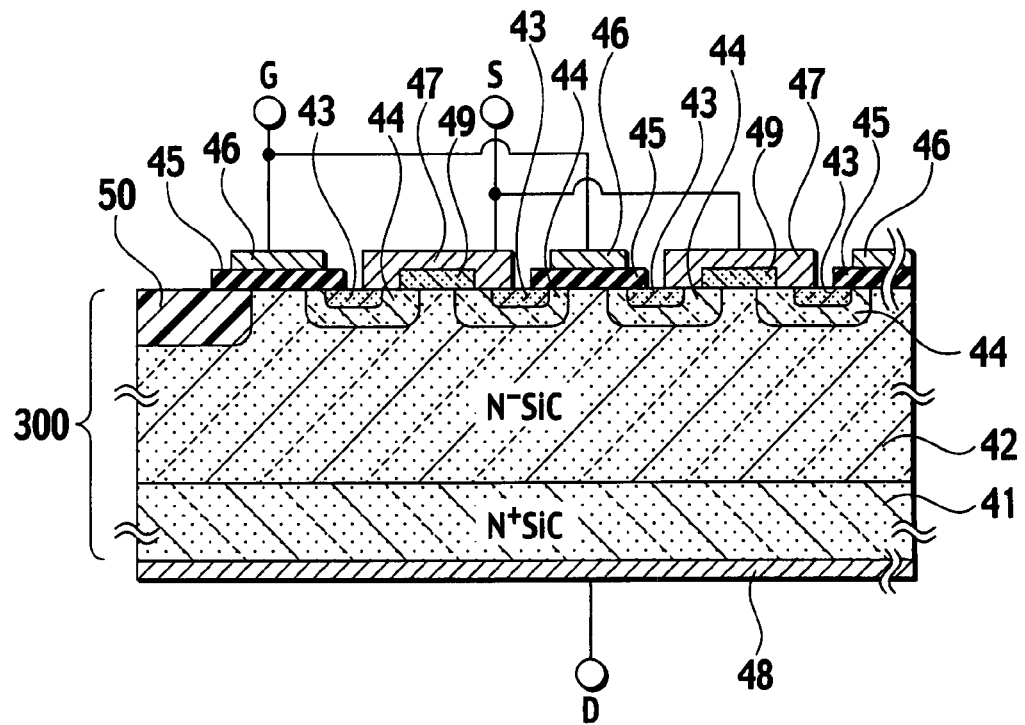
FIG. 15 is a cross-sectional view showing a configuration of a semiconductor device according to a second modification of the second embodiment.

FIG. 15 shows the configuration of a semiconductor device in which a heterojunction diode is contained in a MOSFET comprised of silicon carbide. In FIG. 15, in a first semiconductor region 300 comprised of a drift region 42 and a substrate region 41 of a first conductivity-type, first conductivity-type source regions 43 and second conductivity-type base regions 44 are formed, and gate electrodes 46 are formed so as to contact the drift region 42, the base regions 44, and the source regions 43 via the gate insulating films 45.

The base regions 44 and the source regions 43 are connected to source electrodes 47, and the substrate region 41 is connected to a drain electrode 48. Hetero semiconductor regions 49 having a band gap different from that of the drift region 42 and comprised of polycrystalline silicon, for example, are arranged so as to form heterojunction with the drift region 42. The hetero semiconductor regions 49 are connected to the source electrodes 47. In outer peripheral ends of the active region formed with a MOSFET, an electric-field relaxation region 50 is formed, for example.

Thus, even when the semiconductor device is used as an internal reflux diode of a MOSFET, as explained above, the avalanche breakdown occurs between the hetero semiconductor regions 49 and the drift region 42 when the heterojunction diode is changed from the conduction state to the cutoff state as a result of the application of the drain voltage of a predetermined value or more. Thereby, it becomes possible to pass a current in a wide range of the main region of the active region, so that a high avalanche resistance can be obtained.

Figure 16:
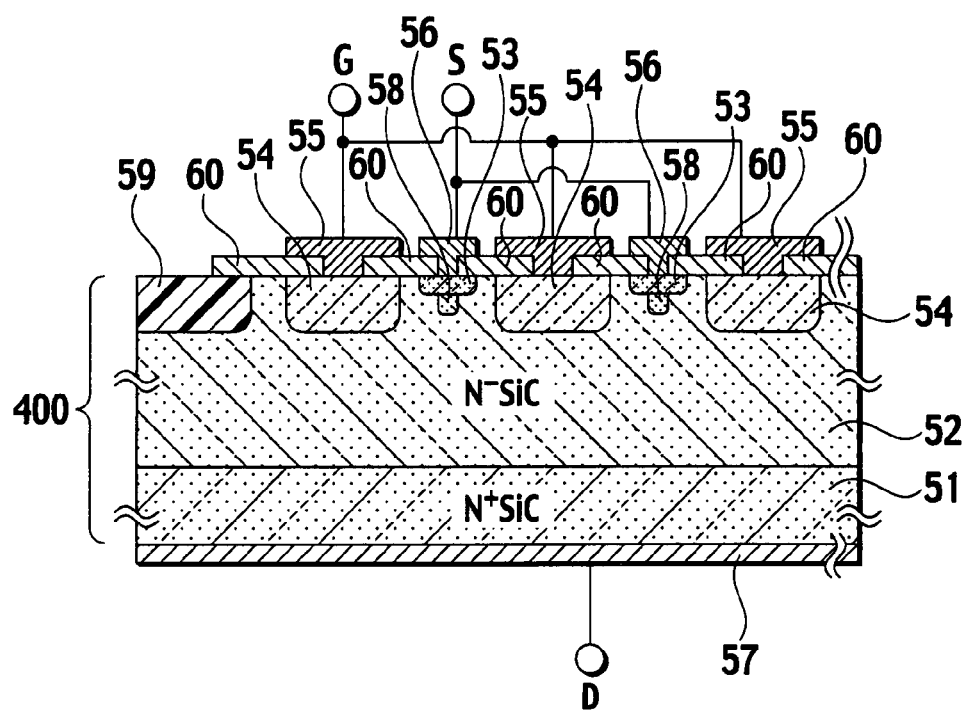
FIG. 16 is a cross-sectional view showing a configuration of a semiconductor device according to a third modification of the second embodiment.

In a configuration shown in FIG. 16, in which the heterojunction diode is contained in a JFET comprised of silicon carbide, too, the similar effect can be obtained as in the configuration shown in FIG. 15. In the configuration shown in FIG. 16, in a first semiconductor region 400 comprised of a drift region 52 and a substrate region 51 of a first conductivity-type, formed are first conductivity-type source regions 53 and second conductivity-type gate regions 54; the gate regions 54 are connected to gate electrodes 55; the source regions 53 are connected to source electrodes 56; and the substrate region 51 is connected to a drain electrode 57.

Hetero semiconductor regions 58 having a band gap different from that of the drift region 52 and comprised of polycrystalline silicon, for example, are arranged so as to form heterojunction with the drift region 52. In this second modification, the source regions 53 and the hetero semiconductor regions 58 are formed in a depth direction of the drawing one after another, and the hetero semiconductor regions 58 are connected to the source electrodes 56. In outer peripheral ends of the active region formed with a JFET, an electric-field relaxation region 59 is formed, for example.

Thus, even when the semiconductor device is used as an internal reflux diode of a JFET, as explained above, the avalanche breakdown occurs between the hetero semiconductor regions 58 and the drift region 52 when the heterojunction diode is changed from the conduction state to the cutoff state as a result of the application of the drain voltage of a predetermined value or more. Thereby, it becomes possible to pass a current in a wide range of the main region of the active region, so that a high avalanche resistance can be obtained.

As described above, in each portion configuring a transistor, when the heterojunction diode having a high avalanche resistance, which is a characteristic of the present invention, is provided even at least in a portion, it becomes possible to greatly improve the breakdown resistance at the time of switching in which the transistor is changed from the conduction state to the cutoff state. Thus, it becomes possible to achieve a higher frequency of a switching frequency and increase an operation range in which the semiconductor device can be safely used.

In the first and second embodiments including the modifications, explanations have been given of the semiconductor device of which substrate material is silicon carbide as an example. However, the substrate material can include other semiconductor materials such as silicon, silicon germanium, gallium nitride, and diamond. In the above explanations, employed as an example is a case where the polytype of silicon carbide is 4H. However, other polytypes such as 6H, and 3C can be also adopted. In the above explanations, employed as an example is a transistor or so-called vertically structured diode, in which the second electrode 5 (drain electrodes 28, 48, and 57) and the first electrode 4 (source electrodes 27, 47, and 56) sandwich the drift regions 2, 22, 42, and 52 and are arranged so as to oppose to each other, and a current passing between the both electrodes is directed in a vertical direction. However, the semiconductor device can be also a transistor or so-called horizontally structured diode, in which the second electrode 5 (drain electrodes 28, 48, and 57) and the first electrode 4 (source electrodes 27, 47, and 56) are arranged on the same main surface, and a current is passed in a horizontal direction.

In the above explanations, employed as an example is a case where polycrystalline silicon is used for the first hetero semiconductor regions 3, 23, 49, and 58, and the second hetero semiconductor regions 9 and 24. However, other silicon materials such as single crystal silicon, and amorphous silicon; other semiconductor materials such as germanium, and silicon germanium; and silicon carbide of other polytypes such as 6H or 3C can be used as long as the material forms heterojunction with silicon carbide. In the above explanations, employed as an example is a case where the N-type silicon carbide is used as the drift regions 2, 22, 42, and 52, and the P-type polycrystalline silicon as the first hetero semiconductor regions 3, 23, 49, and 58. However, any combination such as a combination between N-type silicon carbide and P-type polycrystalline silicon, a combination between P-type silicon carbide and P-type polycrystalline silicon, and a combination between P-type silicon carbide and N-type polycrystalline silicon can be used.

According to the present invention, it becomes possible to cause avalanche breakdown at an equal timing of or earlier than at outer peripheral ends in an entire junction surface of a heterojunction region other than outer peripheral ends of a heterojunction diode. Thereby, an avalanche resistance can be enhanced.

Description has been made of the embodiments to which the invention created by the inventors of the present invention is applied. However, the present invention is not limited to the descriptions and the drawings, which form a part of the disclosure of the present invention according to these embodiments. Specifically, all of other embodiments, examples, operational techniques and the like, which are made by those skilled in the art based on these embodiments, are naturally incorporated in the scope of the present invention. The above is additionally described at the end of this specification.

The entire content of Japanese Patent Application No. TOKUGAN 2006-108557 with a filing date of Apr. 11, 2006, and Japanese Patent Application No. TOKUGAN 2007-024314 with a filing date of Feb. 2, 2007, is hereby incorporated by reference.

What is claimed is:

1. A semiconductor device comprising:
   a heterojunction diode configured by a first semiconductor region, and a second semiconductor region having a band gap different from that of the first semiconductor region and forming a heterojunction with the first semiconductor region; and an avalanche breakdown region in which an impurity density is equal to or less than a predetermined value, provided in a portion or entirety of the second semiconductor region, the predetermined value being a value of impurity density such that a dielectric breakdown electric field of the second semiconductor region is the same as the first semiconductor region, wherein the heterojunction is arranged such that when a predetermined reverse bias is applied to the heterojunction diode, a breakdown voltage at least in a heterojunction region other than outer peripheral ends of the heterojunction diode is a breakdown voltage of the semiconductor device, the breakdown voltage is determined by a voltage caused by avalanche breakdown, and when the predetermined reverse bias is applied to the heterojunction diode, the avalanche breakdown is caused in the avalanche breakdown region.

2. The semiconductor device according to claim 1, comprising an electric-field relaxation region that contacts the first semiconductor region and relaxes an electric field applied to a predetermined portion on a junction interface between the first semiconductor region and the second semiconductor region when the predetermined reverse bias is applied to the heterojunction diode.

3. The semiconductor device according to claim 1, comprising:
a Schottky metallic region that forms a Schottky junction diode with the first semiconductor region, wherein
the Schottky metallic region is electrically connected to at least a portion of the second semiconductor region.

4. The semiconductor device according to claim 1, comprising:
a well region that forms a PN junction diode with the first semiconductor region, wherein
the well region is electrically connected to at least a portion of the second semiconductor region.

5. The semiconductor device according to claim 1, comprising a gate electrode that contacts via a gate insulating film a portion of a junction portion between the first semiconductor region and the second semiconductor region that form the heterojunction diode.

6. The semiconductor device according to claim 1, comprising:
a second conductivity type base region that contacts the first semiconductor region;
a first conductivity type source region; and
a gate electrode that contacts at least the first semiconductor region and the source region via a gate insulating film, wherein
the source region is electrically connected to a portion of the second semiconductor region.

7. The semiconductor device according to claim 1, wherein the first semiconductor region is configured by one element selected from the group consisting of silicon carbide, gallium nitride, and diamond.

8. The semiconductor device according to claim 1, wherein the second semiconductor region is configured by at least one element selected from the group consisting of single crystal silicon, amorphous silicon, polycrystalline silicon, germanium, and silicon germanium.

9. The semiconductor device according to claim 1, wherein the second semiconductor region is configured such that a plurality of semiconductor layers are stacked.

10. The semiconductor device according to claim 9, wherein at least one interlayer of the plurality of semiconductor layers has a portion of which crystalline alignment formed at a boundary is discontinuous.

11. The semiconductor device according to claim 1, comprising
in the second semiconductor region, a third semiconductor region formed of a different impurity conductivity type or of a different impurity density from the avalanche breakdown region.

12. The semiconductor device according to claim 11, wherein the third semiconductor region is a second conductivity type opposite to a first conductivity type by which the first semiconductor region is formed, and has a higher impurity density than at least the avalanche breakdown region.

13. The semiconductor device according to claim 11, comprising:
a first electrode that contacts the first semiconductor region; and
a second electrode that contacts the third semiconductor region, wherein
the first semiconductor region and the first electrode, and the third semiconductor region and the second electrode are ohmic contacted, respectively.

14. The semiconductor device according to claim 11, wherein an impurity density of the second semiconductor region is distributed with a predetermined gradient, a portion with a high impurity density functions as the third semiconductor region, and a portion with a low impurity density functions as the avalanche breakdown region.

15. The semiconductor device according to claim 14, wherein a thickness of the second semiconductor region is equivalent to or thicker than a diffusion length of the impurity density introduced in the second semiconductor region.

* * * * *